(12) United States Patent
Furukawa et al.

(10) Patent No.: US 11,208,529 B2
(45) Date of Patent: Dec. 28, 2021

(54) FLUORINATED ETHER COMPOUND, FLUORINATED ETHER COMPOSITION, COATING LIQUID, ARTICLE AND ITS PRODUCTION METHOD

(71) Applicant: AGC Inc., Chiyoda-ku (JP)

(72) Inventors: Yutaka Furukawa, Chiyoda-ku (JP); Taiki Hoshino, Chiyoda-ku (JP); Keigo Matsuura, Chiyoda-ku (JP); Makoto Uno, Chiyoda-ku (JP); Eiichiro Anraku, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 16/838,061

(22) Filed: Apr. 2, 2020

(65) Prior Publication Data

US 2020/0231747 A1 Jul. 23, 2020

Related U.S. Application Data

(63) Continuation of application No. PCT/JP2018/047628, filed on Dec. 25, 2018.

(30) Foreign Application Priority Data

Dec. 27, 2017 (JP) .............................. JP2017-251611

(51) Int. Cl.
  *C08G 65/00* (2006.01)
  *C07F 7/18* (2006.01)
  *C08G 65/336* (2006.01)
  *C09D 171/00* (2006.01)

(52) U.S. Cl.
  CPC .......... *C08G 65/007* (2013.01); *C07F 7/1804* (2013.01); *C08G 65/336* (2013.01); *C09D 171/00* (2013.01)

(58) Field of Classification Search
  CPC .................. C08G 65/336; C09D 171/00
  See application file for complete search history.

(56) References Cited

U.S. PATENT DOCUMENTS

| | | | | |
|---|---|---|---|---|
| 8,119,760 B2* | 2/2012 | Fukuda | ................ | C08K 5/5406 528/42 |
| 9,580,549 B2* | 2/2017 | Murotani | ................ | C09D 5/00 |
| 9,969,890 B2* | 5/2018 | Takao | ................ | C07C 69/63 |
| 10,563,070 B2* | 2/2020 | Mitsuhashi | ......... | C09D 5/1625 |
| 10,865,312 B2* | 12/2020 | Mitsuhashi | ............. | C09K 3/18 |
| 10,870,729 B2* | 12/2020 | Ishii | ........................ | C09K 3/18 |
| 2005/0277731 A1* | 12/2005 | Fukuda | ................... | C08L 71/02 524/588 |
| 2009/0292096 A1* | 11/2009 | Fukuda | ................ | C08K 5/5406 528/31 |
| 2015/0307719 A1* | 10/2015 | Mitsuhashi | .......... | C09D 171/02 428/447 |
| 2018/0030280 A1* | 2/2018 | Mitsuhashi | ............. | C09D 5/16 |
| 2018/0326701 A1* | 11/2018 | Honda | .................... | B32B 9/007 |
| 2019/0177574 A1* | 6/2019 | Takeda | .................... | C03C 17/42 |
| 2019/0276705 A1* | 9/2019 | Valsecchi | ............. | C08G 65/331 |
| 2021/0024776 A1* | 1/2021 | Katayama | ........... | C08G 65/336 |

FOREIGN PATENT DOCUMENTS

| | | | | |
|---|---|---|---|---|
| CN | 105524552 A | * | 4/2016 | |
| WO | WO-2005091070 A1 | * | 9/2005 | ............. G03F 7/168 |
| WO | WO 2017/038830 A1 | | 3/2017 | |
| WO | WO 2017/038832 A1 | | 3/2017 | |
| WO | WO 2018/056413 A1 | | 3/2018 | |

OTHER PUBLICATIONS

CAS Abstract CN 105524552 (Apr. 27, 2016) (Year: 2016).*
J. Omotowa et al. 121 Journal of the American Chemical Society, 11130-11138 (1999) (Year: 1999).*
PCT/JP2018/047628, Written Opinion of the International Searching Authority (dated Feb. 4, 2017) (Year: 2017).*
International Search Report dated Apr. 2, 2019 in PCT/JP2018/047628 filed on Dec. 25, 2018, 2 pages.

* cited by examiner

*Primary Examiner* — Alexander R Pagano
(74) *Attorney, Agent, or Firm* — Oblon, McClelland, Maier & Neustadt, L.L.P.

(57) ABSTRACT

To provide a fluorinated ether compound capable of forming a surface layer excellent in fingerprint stain removability and abrasion resistance as before and more excellent in light resistance than ever.
A fluorinated ether compound represented by $A^1$—O—$(R^{f1}O)_m$—$A^2$, wherein $A^1$ is a perfluoroalkyl group or the like, $A^2$ is —$Q^1[—C(R^{11})_b(R^{12})_{3-b}]_a$ or the like, $R^{f1}$ is a fluoroalkylene group, m is from 2 to 500, $Q^1$ is a a+1 valent organic group, $R^{11}$ is —$Q^2$—$Si(R^{21})_c(R^{22})_d(R^{23})_e$, $R^{12}$ is a hydrogen atom, a halogen atom or the like, a is an integer of from 1 to 3, b is 2 or 3, $Q^2$ is a single bond or a bivalent organic group, $R^{21}$ is —$Q^3$—$Si(R^{31})_{3-g}(R^{32})_g$, $R^{22}$ is an alkyl group, $R^{23}$ is a hydrolyzable group or a hydroxy group, c, d and e are from 0 to 3, c+d+e is 3, c in at last one $R^{11}$ among a plurality of $R^{11}$ is 2 or 3, $Q^3$ is a bivalent organic group, $R^{31}$ is an alkyl group, $R^{32}$ is a hydrolyzable group or a hydroxy group, and g is from 1 to 3.

11 Claims, No Drawings

FLUORINATED ETHER COMPOUND, FLUORINATED ETHER COMPOSITION, COATING LIQUID, ARTICLE AND ITS PRODUCTION METHOD

TECHNICAL FIELD

The present invention relates to a fluorinated ether compound, a fluorinated ether composition, a coating liquid, an article and its production method.

BACKGROUND ART

A fluorinated ether compound having a poly(oxyperfluoroalkylene) chain is capable of forming on a surface of a substrate a surface layer having high lubricity, water/oil repellency, etc. and thus is suitably used for a surface treatment agent. A surface treatment agent containing the fluorinated ether compound is used in an application where it is desired to maintain, for a long period of time, a performance (abrasion resistance) whereby water/oil repellency is less likely to be lowered even if the surface layer is rubbed repeatedly with fingers, and a performance (fingerprint stain removability) whereby a fingerprint adhering to the surface layer can be readily removed by wiping, for example, as a surface treatment agent for a member constituting a plane of a touch panel to be touched with fingers, a spectacle lens, a display of a wearable terminal, etc.

As a fluorinated ether compound capable of forming on a surface of a substrate a surface layer excellent in abrasion resistance and fingerprint stain removability, the following has been proposed.

A fluorinated ether compound which has a poly(oxyperfluoroalkylene) chain and three hydrolyzable silyl glurps introduced to one terminal of the chain via a branch by a carbon atom (Patent Document 1).

A fluorinated ether compound which has a poly(oxyperfluoroalkylene) chain and two hydrolyzable silyl groups introduced to one terminal of the chain via a branch by a nitrogen atom (Patent Document 2).

PRIOR ART DOCUMENTS

Patent Document

Patent Document 1: WO2017/038830
Patent Document 2: WO2017/038832

DISCLOSURE OF INVENTION

Technical Problem

The fluorinated ether compounds in Patent Documents 1 and 2 are excellent not only in fingerprint stain removability and abrasion resistance but also in light resistance. In recent years, a surface layer of e.g. a member constituting a plane of a touch panel to be touched with fingers is required to have further improved light resistance. Accordingly, a fluorinated ether compound capable of forming a surface layer more excellent in light resistance while maintaining fingerprint stain removability and abrasion resistance, may sometimes be required.

An object of the present invention is to provide a fluorinated ether compound capable of forming a surface layer excellent in fingerprint stain removability and abrasion resistance as before and more excellent in light resistance than ever; a fluorinated ether composition and a coating liquid containing the fluorinated ether compound; an article having a surface layer excellent in fingerprint stain removability and abrasion resistance as before and more excellent in light resistance than ever; and a method for producing it.

Another object of the present invention is to provide a fluorinated ether compound useful as an intermediate of a fluorinated ether compound suitably used for a surface treatment agent.

Solution to Problem

The present invention provides a fluorinated ether compound, a fluorinated ether composition, a coating liquid, an article, a method for producing an article, and another embodiment of a fluorinated ether compound, having the following constitutions [1] to [13].

[1] A fluorinated ether compound, which is a compound represented by the following formula (1):

$$A^1\text{---}O\text{---}(R^{f1}O)_m\text{---}A^2 \tag{1}$$

wherein $A^1$ is a $C_{1-20}$ perfluoroalkyl group, a group represented by the following formula (g1-1), a group represented by the following formula (g1-2) or a group represented by the following formula (g1-3), $A^2$ is a group represented by the following formula (g1-1), a group represented by the following formula (g1-2) or a group represented by the following formula (g1-3), $R^{f1}$ is a fluoroalkylene group, m is an integer of from 2 to 500, and $(R^{f1}O)_m$ may consist of two or more types of $R^{f1}O$ differing in the number of carbon atoms:

$$\text{---}Q^1[\text{---}C(R^{11})_b(R^{12})_{3-b}]_a \tag{g1-1}$$

$$\text{---}Q^1[\text{---}N(R^{11})_2]_a \tag{g1-2}$$

$$\text{---}Q^1[\text{---}Z(R^{11})_n]_a \tag{g1-3}$$

wherein $Q^1$ is a a+1 valent organic group (provided that the terminal bonded to the terminal oxygen atom of $O(R^{f1}O)_m$ is $CF_2$ or CHF), Z is a group having a n+1 valent cyclic structure having a carbon atom or a nitrogen atom to which $Q^1$ is directly bonded and a carbon atom or a nitrogen atom to which $R^{11}$ is directly bonded, $R^{11}$ is a group represented by the following formula (g2), $R^{12}$ is a hydrogen atom, a halogen atom, a hydroxy group or a monovalent organic group, a is an integer of from 1 to 3, b is 2 or 3, n is an integer of at least 2, when a is at least 2, the a $[\text{---}C(R^{11})_b(R^{12})_{3-b}]$ may be the same or different, the a $[\text{---}N(R^{11})_2]$ may be the same or different, and the a $[\text{---}Z(R^{11})_n]$ may be the same or different, and a plurality of $R^{11}$ may be the same or different;

$$\text{---}Q^2\text{---}Si(R^{21})_c(R^{22})_d(R^{23})_e \tag{g2}$$

wherein $Q^2$ is a single bond or a bivalent organic group, $R^{21}$ is a group represented by the following formula (g3), $R^{22}$ is an alkyl group, $R^{23}$ is a hydrolyzable group or a hydroxy group, c, d and e are each independently an integer of from 0 to 3, c+d+e is 3, in at least one $R^{11}$ among a plurality of $R^{11}$ in each of $A^1$ and $A^2$, c is 2 or 3, when c is at least 2, the c $R^{21}$ may be the same or different, when d is at least 2, the d $R^{22}$ may be the same or different, when e is at least 2, the e $R^{23}$ may be the same or different;

$$-Q^3-Si(R^{31})_{3-g}(R^{32})_g \quad (g3)$$

wherein $Q^3$ is a bivalent organic group,
$R^{31}$ is an alkyl group,
$R^{32}$ is a hydrolyzable group or a hydroxy group,
g is an integer of from 1 to 3,
when g is 1, the two $R^{31}$ may be the same or different, and
when g is at least 2, the g $R^{32}$ may be the same or different.

[2] The fluorinated ether compound according to [1], wherein a is 1.

[3] The fluorinated ether compound according to [1] or [2], wherein $Q^2$ is a single bond or a $C_{1-6}$ alkylene group.

[4] The fluorinated ether compound according to any one of [1] to [3], wherein $Q^3$ is a $C_{2-6}$ alkylene group.

[5] The fluorinated ether compound according to any one of [1] to [4], wherein $A^1$ is a $C_{1-20}$ perfluoroalkyl group.

[6] A fluorinated ether composition comprising at least one type of the fluorinated ether compound as defined in any one of [1] to [5], and other fluorinated ether compound.

[7] A coating liquid comprising the fluorinated ether compound as defined in any one of [1] to [5] or the fluorinated ether composition as defined in [6], and a liquid medium.

[8] An article comprising a substrate and a surface layer formed of the fluorinated ether compound as defined in any one of [1] to [5] or the fluorinated ether composition as defined in [6] on a surface of the substrate.

[9] The article according to [8], which has the surface layer on a surface of a member constituting a plane of a touch panel to be touched with fingers.

[10] A method for producing an article, which comprises treating a surface of a substrate by dry coating method using the fluorinated ether compound as defined in any one of [1] to [5] or the fluorinated ether composition as defined in [6] to form a surface layer formed of the fluorinated ether compound or the fluorinated ether composition on the surface of the substrate.

[11] A method for producing an article, which comprises applying the coating liquid as defined in [7] to a surface of a substrate by wet coating method, followed by drying to form a surface layer formed of the fluorinated ether compound or the fluorinated ether composition on the surface of the substrate.

[12] A fluorinated ether compound, which is a compound represented by the following formula (2):

$$A^{10}-O-(R^{f1}O)_m-A^{20} \quad (2)$$

wherein $A^{10}$ is a $C_{1-20}$ perfluoroalkyl group, a group represented by the following formula (g4-1), a group represented by the following formula (g4-2) or a group represented by the following formula (g4-3),
$A^{20}$ is a group represented by the following formula (g4-1), a group represented by the following formula (g4-2) or a group represented by the following formula (g4-3),
$R^{f1}$ is a fluoroalkylene group,
m is an integer of from 2 to 500, and
$(R^{f1}O)_m$ may consist of two or more types of $R^{f1}O$ differing in the number of carbon atoms:

$$-Q^1[-C(R^{110})_b(R^{12})_{3-b}]_a \quad (g4\text{-}1)$$

$$-Q^1[-N(R^{110})_2]_a \quad (g4\text{-}2)$$

$$-Q^1[-Z(R^{110})_n]_a \quad (g4\text{-}3)$$

wherein $Q^1$ is a a+1 valent organic group (provided that the terminal bonded to the terminal oxygen atom of $O(R^{f1}O)_m$ is $CF_2$ or CHF), Z is a group having a n+1 valent cyclic structure having a carbon atom or a nitrogen atom to which $Q^1$ is directly bonded and a carbon atom or a nitrogen atom to which $R^{110}$ is directly bonded,
$R^{110}$ is a group represented by the following formula (g5),
$R^{12}$ is a hydrogen atom, a halogen atom, a hydroxy group or a monovalent organic group,
a is an integer of from 1 to 3,
b is 2 or 3,
n is an integer of at least 2,
when a is at least 2, the a $[-C(R^{110})_b(R^{12})_{3-b}]$ may be the same or different, the a $[-N(R^{110})_2]$ may be the same or different, and the a $[-Z(R^{110})_n]$ may be the same or different, and
a plurality of $R^{110}$ may be the same or different;

$$-Q^2-Si(R^{210})_c(R^{22})_d(R^{23})_e \quad (g5)$$

wherein $Q^2$ is a single bond or a bivalent organic group,
$R^{210}$ is a group represented by the following formula (g6),
$R^{22}$ is an alkyl group,
$R^{23}$ is a hydrolyzable group or a hydroxy group,
c, d and e are each independently an integer of from 0 to 3,
c+d+e is 3,
in at least one $R^{110}$ among a plurality of $R^{110}$ in each of $A^{10}$ and $A^{20}$, c is 2 or 3,
when c is at least 2, the c $R^{210}$ may be the same or different,
when d is at least 2, the d $R^{22}$ may be the same or different,
when e is at least 2, the e $R^{23}$ may be the same or different;

$$-Q^{30}-CH=CH_2 \quad (g6)$$

wherein $Q^{30}$ is a single bond or a bivalent organic group.

[13] The fluorinated ether compound according to [12], wherein $A^{10}$ is a $C_{1-20}$ perfluoroalkyl group.

Advantageous Effects of Invention

By the fluorinated ether compound of the present invention, it is possible to form a surface layer excellent in fingerprint stain removability and abrasion resistance as before and more excellent in light resistance than ever.

By the fluorinated ether composition of the present invention, it is possible to form a surface layer excellent in fingerprint stain removability and abrasion resistance as before and more excellent in light resistance than ever.

By the coating liquid of the present invention, it is possible to form a surface layer excellent in fingerprint stain removability and abrasion resistance as before and more excellent in light resistance than ever.

The article of the present invention has a surface layer excellent in fingerprint stain removability and abrasion resistance as before and more excellent in light resistance than ever.

According to the method for producing an article of the present invention, it is possible to produce an article having a surface layer excellent in fingerprint stain removability and abrasion resistance as before and more excellent in light resistance than ever.

According to another embodiment, the fluorinated ether compound of the present invention is useful as an intermediate of the fluorinated ether compound suitably used for a surface treatment agent.

DESCRIPTION OF EMBODIMENTS

In this specification, a compound represented by the formula (1) will be referred to as compound (1). Compounds represented by other formulae will be referred to in the same manner.

Further, a group represented by the formula (g1) will be referred to as group (g1). Groups represented by other formulae will be referred to in the same manner.

The chemical formula of the oxyfluoroalkylene unit is represented so that its oxygen atom is described on the right-side of the fluoroalkylene group.

In this specification, meanings of the following terms are as follows.

A "hydrolyzable silyl group" means a group capable of forming a silanol group (Si—OH) by being hydrolyzed. The hydrolyzable silyl group may, for example, be $Si(R^{31})_{3-g}(R^{32})_g$ in the formula (g3).

A "surface layer" means a layer formed on the surface of a substrate.

The "number average molecular weight" of the fluorinated ether compound is calculated by obtaining the number (average value) of oxyperfluoroalkylene groups on the basis of the terminal group, by $^1$H-NMR and $^{19}$F-NMR. The terminal group may, for example, be $A^1$ in the formula (1) or $Si(R^{31})_{3-g}(R^{32})_g$ in the formula (g3).

[Fluorinated Ether Compound]

A fluorinated ether compound of the present invention is a compound (1):

$$A^1—O—(R^{f1}O)_m—A^2 \quad (1)$$

wherein $A^1$ is a $C_{1-20}$ perfluoroalkyl group, group (g1-1), group (g1-2) or group (g1-3), $A^2$ is group (g1-1), group (g1-2) or group (g1-3), $R^{f1}$ is a fluoroalkylene group, m is an integer of from 2 to 500, and $(R^{f1}O)_m$ may consist of two or more types of $R^{f1}O$ differing in the number of carbon atoms:

$$—Q^1[—C(R^{11})_b(R^{12})_{3-b}]_a \quad (g1-1)$$

$$—Q^1[—N(R^{11})_2]_a \quad (g1-2)$$

$$—Q^1[—Z(R^{11})_n]_a \quad (g1-3)$$

wherein $Q^1$ is a a+1 valent organic group (provided that the terminal bonded to the terminal oxygen atom of $O(R^{f1}O)_m$ is $CF_2$ or CHF), Z is a group having a n+1 valent cyclic structure having a carbon atom or a nitrogen atom to which $Q^1$ is directly bonded and a carbon atom or a nitrogen atom to which $R^{11}$ is directly bonded, $R^{11}$ is group (g2), $R^{12}$ is a hydrogen atom, a halogen atom, a hydroxy group or a monovalent organic group, a is an integer of from 1 to 3, b is 2 or 3, n is an integer of at least 2, when a is at least 2, the a $[—C(R^{11})_b(R^{12})_{3-b}]$ may be the same or different, the a $[—N(R^{11})_2]$ may be the same or different, and the a $[—Z(R^{11})_n]$ may be the same or different, and a plurality of $R^{11}$ may be the same or different;

$$—Q^2—Si(R^{21})_c(R^{22})_d(R_{23})_e \quad (g2)$$

wherein $Q^2$ is a single bond or a bivalent organic group, $R^{21}$ is group (g3), $R^{22}$ is an alkyl group, $R^{23}$ is a hydrolyzable group or a hydroxy group, c, d and e are each independently an integer of from 0 to 3, c+d+e is 3, in at least one $R^{11}$ among a plurality of $R^{11}$ in each of $A^1$ and $A^2$, c is 2 or 3, when c is at least 2, the c $R^{21}$ may be the same or different, when d is at least 2, the d $R^{22}$ may be the same or different, when e is at least 2, the e $R^{23}$ may be the same or different;

$$—Q^3—Si(R^{31})_{3-g}(R^{32})_g \quad (g3)$$

wherein $Q^3$ is a bivalent organic group, $R^{31}$ is an alkyl group, $R^{32}$ is a hydrolyzable group or a hydroxy group, g is an integer of from 1 to 3, when g is 1, the two $R^{31}$ may be the same or different, and when g is at least 2, the g $R^{32}$ may be the same or different.

$A^1$ is preferably a $C_{1-20}$ perfluoroalkyl group, in that the resulting surface layer will be more excellent in lubricity and abrasion resistance. The compound (1) wherein $A^1$ is a perfluoroalkyl group has, since $A^1$ has $CF_3$— at its terminal, $CF_3$— at one terminal, and has a hydrolyzable silyl group or a silanol group at the other terminal. According to the compound (1) wherein one terminal is $CF_3$— and the other terminal is a hydrolyzable silyl group or a silanol group, a surface layer having a low surface energy can be formed, whereby the surface layer is more excellent in lubricity and abrasion resistance as compared with that formed of the compound (1) having a hydrolyzable silyl group or a silanol group at both terminals (the compound (1) wherein $A^1$ is any of the group (g1) to the group (g3)).

The number of carbon atoms in the perfluoroalkyl group as $A^1$ is preferably from 1 to 10, more preferably from 1 to 6, particularly preferably from 1 to 3, in that the surface layer formed of the compound (1) will be more excellent in lubricity and abrasion resistance.

The number of carbon atoms in $R^{f1}$ is preferably from 1 to 6, in that the surface layer will be more excellent in abrasion resistance and fingerprint stain removability.

$R^{f1}$ is preferably a linear fluoroalkylene group in that the surface layer will be more excellent in abrasion resistance and lubricity.

$R^{f1}$ is preferably a perfluoroalkylene group in that the surface layer will be more excellent in abrasion resistance and lubricity.

The proportion of the perfluoroalkylene group to the entire $R^{f1}$ is preferably at least 60 mol %, more preferably at least 80 mol %, particularly preferably 100 mol %, in that the surface layer will be more excellent in abrasion resistance and lubricity.

m is preferably an integer of from 2 to 200, more preferably an integer of from 5 to 150, particularly preferably an integer of from 10 to 100. When m is at least the lower limit value of the above range, the surface layer will be more excellent in water/oil repellency. When m is at most the upper limit value of the above range, the surface layer will be more excellent in abrasion resistance. That is, if the number average molecular weight of the compound (1) is too high, the number of hydrolyzable silyl groups or silanol groups present per unit molecular weight decreases, and the abrasion resistance of the surface layer will be lowered.

In $(R^{f1}O)_m$, when at least two types of $R^{f1}O$ are present, the bonding order of the respective $R^{f1}O$ is not limited. For example, when $CF_2O$ and $CF_2CF_2O$ are present, such $CF_2O$ and $CF_2CF_2O$ may be arranged randomly, alternately or in block.

At least two types of $R^{f1}O$ being present means that at least two types of $R^{f1}O$ differing in the number of carbon atoms are present, at least two types of $R^{f1}O$ differing in the number of hydrogen atoms are present, at least two types of $R^{f1}O$ differing in the positions of hydrogen atoms are present, and at least two types of $R^{f1}O$ differing in whether side chains are present or not or in the type of side chains (e.g. the number of side chains, the number of carbon atoms in the side chain) even having the same number of carbon atoms, are present.

With respect to arrangement of at least two types of $R^{f1}O$, for example, a structure represented by $\{(CF_2O)_{m1}(CF_2CF_2O)_{m2}\}$ indicates that m1 pieces of $(CF_2O)$ and m2 pieces of $(CF_2CF_2O)$ are randomly arranged. Further, a structure represented by $(CF_2CF_2O-CF_2CF_2CF_2CF_2O)_{m5}$ indicates that m5 pieces of $(CF_2CF_2O)$ and m5 pieces of $(CF_2CF_2CF_2CF_2O)$ are alternately arranged.

As $(R^{f1}O)_m$, preferred is $(R^{f1}O)_m$ having the following structure in at least a part thereof.

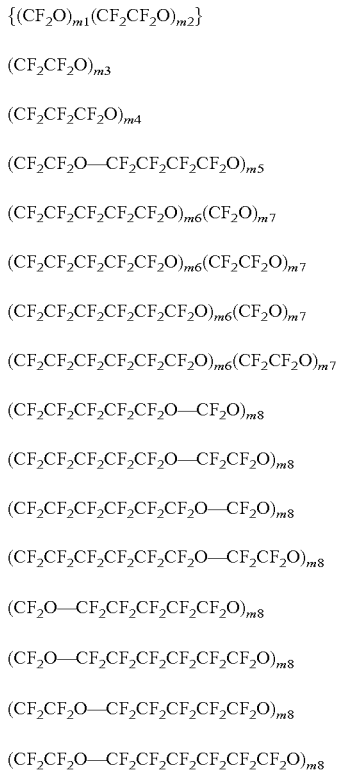

wherein m1 is an integer of at least 1, m2 is an integer of at least 1, m1+m2 is an integer of from 2 to 500, m3 and m4 are each an integer of from 2 to 500, m5 is an integer of from 1 to 250, m6 and m7 are each an integer of at least 1, m6+m7 is an integer of from 2 to 500, and m8 is an integer of from 1 to 250.

$(R^{f1}O)_m$ is preferably as follows, in view of easy production of the compound (1).

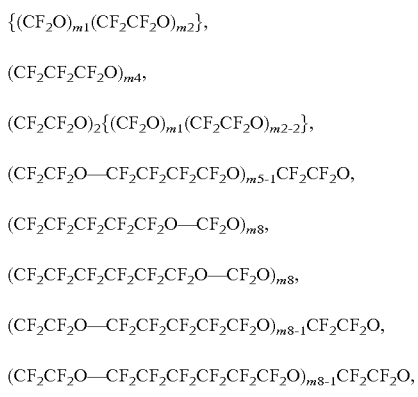

wherein m2, m5 and m8 are selected so that m2-2, m5-1 and m8-1 are an integer of at least 1.

a is preferably from 1 to 2, particularly preferably 1, in that the compound (1) is easily produced, the surface of the substrate is uniformly coated with the compound (1), and the obtainable surface layer will be excellent in physical properties.

$Q^1$ may have a bond selected from the group consisting of —C(O)NR—, —C(O)O—, —C(O)—, —O—, —NR—, —S—, —NHC(O)O—, —NHC(O)NR—, —SO$_2$NR— and Si(R)$_2$— wherein R is a hydrogen atom, a $C_{1-6}$ alkyl group or a phenyl group (hereinafter referred to as "bond B"). The bond B is preferably a bond selected from the group consisting of —C(O)NR—, —C(O)— and Si(R)$_2$— in that the surface layer will be more excellent in light resistance and chemical resistance.

The organic group as $Q^1$ is, in that the surface layer will be more excellent in light resistance and chemical resistance, preferably a fluorohydrocarbon group, a combination of a fluorohydrocarbon group and the bond B or a combination of a fluorohydrocarbon group, the bond B and a hydrocarbon group, particularly preferably a fluorohydrocarbon group. The number of carbon atoms in $Q^1$ is preferably from 1 to 10, more preferably from 1 to 6, particularly preferably from 1 to 4.

When a is 1, $Q^1$ is, in that the compound (1) is easily produced and the resulting surface layer will be more excellent in light resistance and chemical resistance, preferably group (g11), group (g12), group (g13) or group (g14).

 (g11)

 (g12)

 (g13)

 (g14)

wherein $R^{f2}$ is a fluoroalkylene group (having at least one fluorine atom bonded to the terminal carbon atom on the $Q^{11}$ side and to the terminal carbon atom on the $O(R^{f1}O)_m$ side), $Q^{11}$ is a single bond or an alkylene group, and R is a hydrogen atom, a $C_{1-6}$ alkyl group or a phenyl group. The $R^{f2}$ side is bonded to the terminal oxygen atom of $O(R^{f1}O)_m$.

The number of carbon atoms in $R^{f2}$ is preferably from 1 to 8, more preferably from 1 to 6, particularly preferably from 1 to 5, in that the resulting surface layer will be more excellent in abrasion resistance and fingerprint stain removability.

$R^{f2}$ is preferably a linear fluoroalkylene group in that the surface layer will be more excellent in abrasion resistance and lubricity.

$R^{f2}$ is preferably a perfluoroalkylene group in that the surface layer will be more excellent in abrasion resistance and lubricity.

The structure of $R^{f2}$ depends on the raw materials and the method for preparing the compound (1).

The number of carbon atoms in the alkylene group as $Q^{11}$ is preferably from 1 to 6.

$R^{12}$ may have a bond B.

The organic group as $R^{12}$ is, in that the surface layer will be more excellent in light resistance and chemical resistance, preferably a hydrocarbon group, a fluorohydrocarbon group or a combination of a hydrocarbon group and the bond B, particularly preferably a hydrocarbon group. The hydrocarbon group is preferably a saturated aliphatic hydrocarbon group, an aromatic hydrocarbon group or a combination thereof, particularly preferably an alkyl group. The number of carbon atoms in $R^{12}$ is preferably from 1 to 6, more preferably from 1 to 4, particularly preferably from 1 to 3.

The cyclic structure as Z is, in that the compound (1) is easily produced, and the resulting surface layer will be more excellent in abrasion resistance, light resistance and chemical resistance, preferably a cyclic structure selected from the group consisting of a 3- to 8-membered alicyclic ring, a 3- to 8-membered aromatic ring, a 3- to 8-membered heterocyclic ring, and a condensed ring comprising two or more of such rings, particularly preferably the following cyclic structures.

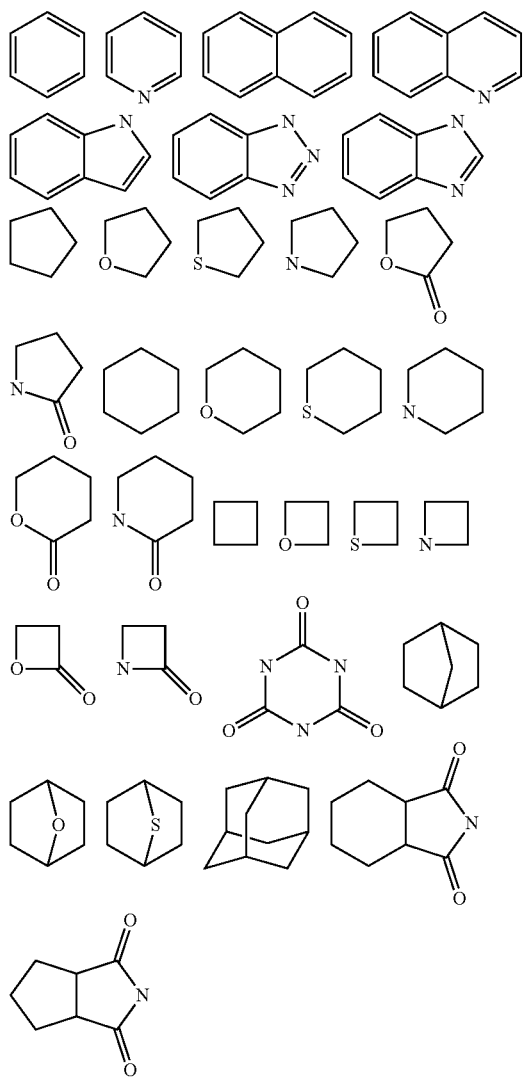

The cyclic structure in Z may have a substituent such as a halogen atom, an alkyl group (which may have an etheric oxygen atom between carbon atoms), a cycloalkyl group, an alkenyl group, an allyl group, an alkoxy group or an oxo group (=O). Since $Q^1$ and $R^{11}$ are directly bonded to the cyclic structure as Z, it will not happen that an alkylene group for example is bonded to the cyclic structure and $Q^1$ or $R^{11}$ is bonded to the alkylene group.

n is preferably from 2 to 6, more preferably from 2 to 4, particularly preferably from 2 to 3, whereby the compound (1) is easily produced and the resulting surface layer will be more excellent in abrasion resistance, light resistance and chemical resistance. When n is at least 2, the compound (1) will be firmly bonded to the surface of the substrate, whereby the surface layer will be more excellent in abrasion resistance, light resistance and chemical resistance. When n is at most 6, the raw materials will be easily available, and the compound (1) is easily produced. Further, the terminal on the hydrolyzable silyl group side of the compound (1) will not be bulky, and the density of the compound (1) on the surface of the substrate is relatively high and as a result, the surface layer will be more excellent in abrasion resistance, light resistance and chemical resistance.

$Q^2$ may have the bond B.

The organic group as $Q^2$ is, in that the resulting surface layer will be more excellent in light resistance and chemical resistance, preferably a hydrocarbon group, a fluorohydrocarbon group, a combination of a hydrocarbon group and the bond B, or a combination of a fluorohydrocarbon group, the bond B and a hydrocarbon group, particularly preferably a hydrocarbon group. The hydrocarbon group is preferably a saturated aliphatic hydrocarbon group, an aromatic hydrocarbon group or a combination thereof, particularly preferably an alkylene group. The number of carbon atoms in $Q^2$ is, in that the surface layer will be more excellent in light resistance and chemical resistance, preferably from 1 to 10, more preferably from 1 to 6, particularly preferably from 1 to 4.

$Q^2$ is, in that the compound (1) is easily produced, and the resulting surface layer will be more excellent in abrasion resistance, light resistance and chemical resistance, preferably a single bond or a $C_{1-6}$ alkylene group, particularly preferably a single bond or a $C_{1-4}$ alkylene group.

The number of carbon atoms in the alkyl group as $R^{22}$ is preferably from 1 to 6, more preferably from 1 to 3, particularly preferably from 1 to 2. When the number of carbon atoms in the alkyl group as $R^{22}$ is within such a range, the compound (1) is easily produced.

The hydrolyzable group as $R^{23}$ is a group which becomes a hydroxy group by hydrolysis reaction. That is, Si—$R^{23}$ becomes a silanol group (Si—OH) by hydrolysis reaction. Silanol groups will further be intermolecularly reacted to form Si—O—Si bonds. Further, a silanol group will undergo dehydration condensation reaction with a hydroxy group (substrate-OH) on the surface of a substrate, to form a chemical bond (substrate-O—Si).

$R^{23}$ may, for example, be an alkoxy group, a halogen atom, an acyl group or an isocyanate group. The alkoxy group is preferably a $C_{1-4}$ alkoxy group. The halogen atom is preferably a chlorine atom.

$R^{23}$ is, in view of easy production of the compound (1), preferably an alkoxy group or a halogen atom. $R^{23}$ is, since outgassing during application will be less, and storage stability of the compound (1) will be excellent, preferably a $C_{1-4}$ alkoxy group, and in a case where long term storage stability of the compound (1) is required, particularly preferably an ethoxy group, and in a case where the reaction time after coating should be short, particularly preferably a methoxy group.

$Q^3$ may have the bond B.

The organic group as $Q^3$ is, in that the resulting surface layer will be more excellent in light resistance and chemical resistance, preferably a hydrocarbon group, or a combination of a hydrocarbon group and the bond B, particularly preferably a hydrocarbon group. The hydrocarbon group is preferably a saturated aliphatic hydrocarbon group, an aromatic hydrocarbon group, or a combination thereof, particularly preferably an alkylene group. The number of carbon atoms in $Q^3$ is, in that the surface layer will be more excellent in light resistance and chemical resistance, preferably from 1 to 10, more preferably from 2 to 6, particularly preferably from 2 to 4.

$Q^3$ is, in that the compound (1) is easily produced and the resulting surface layer will be more excellent in abrasion resistance, light resistance and chemical resistance, preferably a $C_{2-6}$ alkylene group, particularly preferably a $C_{2-4}$ alkylene group.

Particularly when a is 1, $Q^2$ is a single bond or a $C_{1-6}$ alkylene group, and $Q^3$ is a $C_{2-6}$ alkylene group, it is considered that in the compound (1), suppression of oxidative destruction at the C—C bond branched from the carbon atom, and improvement in the strength of the Si—C bond branched from the silicon atom, will be more effectively obtained, and the resulting surface layer will be more excellent in abrasion resistance and light resistance.

$Si(R^{31})_{3-g}(R^{32})_g$ is a hydrolyzable silyl group.

The compound (1) has more than one hydrolyzable silyl groups at least at one terminal. The compound (1) having more than one hydrolyzable silyl groups at its terminal is firmly chemically bonded to the substrate, whereby the resulting surface layer will be excellent in abrasion resistance.

Further, the compound (1) preferably has hydrolyzable silyl groups at only one terminal. The compound (1) having hydrolyzable silyl groups only at one terminal is less likely to aggregate, and is thereby capable of forming a surface layer excellent in outer appearance. Further, the surface layer will be excellent in lubricity and abrasion resistance.

As $R^{31}$, groups similar to $R^{22}$ may be mentioned, and the preferred embodiment is also the same.

As $R^{32}$, groups similar to $R^{23}$ may be mentioned, and the preferred embodiment is also the same.

g is preferably 2 or 3, particularly preferably 3. By the presence of a plurality of $R^{32}$ in one hydrolyzable silyl group, the adhesion to a substrate will be more firm.

As $Si(R^{31})_{3-g}(R^{32})_g$, $Si(OCH_3)_3$, $SiCH_3(OCH_3)_2$, $Si(OCH_2CH_3)_3$, $SiCl_3$, $Si(OCOCH_3)_3$ or $Si(NCO)_3$ is preferred. In view of handling efficiency in industrial production, $Si(OCH_3)_3$ is particularly preferred.

The plurality of $Si(R^{31})_{3-g}(R^{32})_g$ in the compound (1) may be the same or different. From the production efficiency of the compound (1), they are preferably the same group.

As the compound (1), for example, the following compounds may be mentioned. The following compounds are preferred in that they are industrially easily produced and are easily handled, and the resulting surface layer will be more excellent in water/oil repellency, abrasion resistance, fingerprint stain removability, lubricity, chemical resistance, light resistance and chemical resistance, and particularly excellent in light resistance.

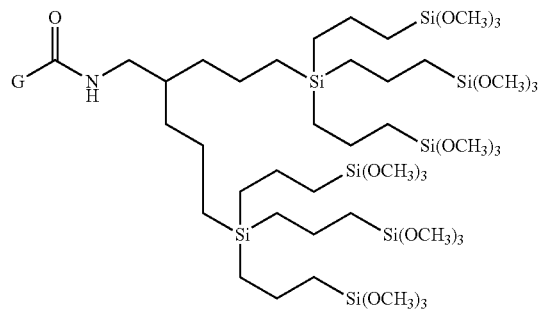

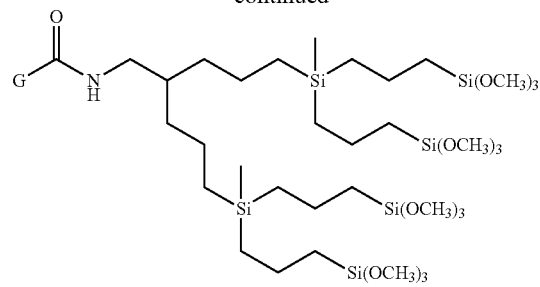

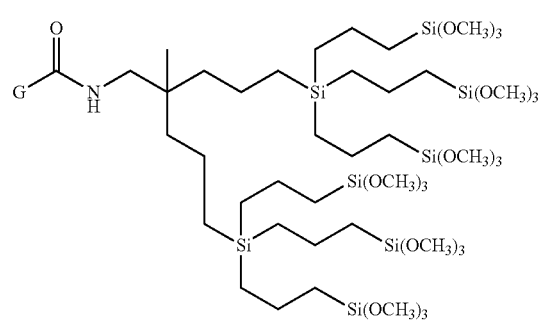

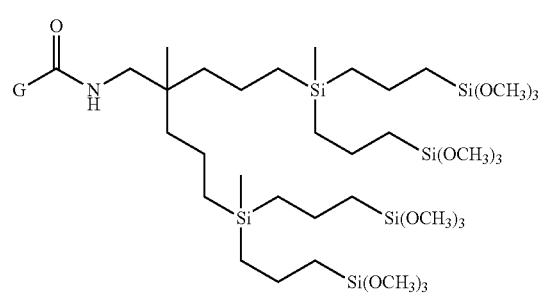

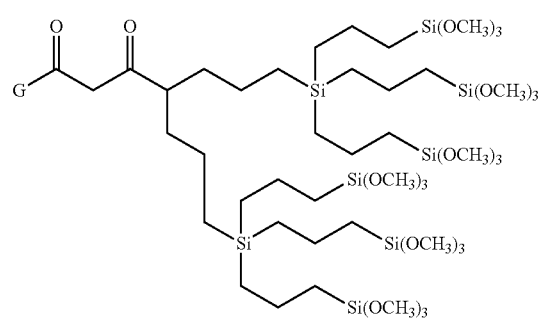

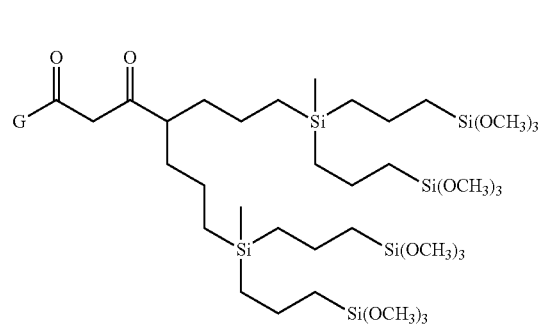

13
-continued
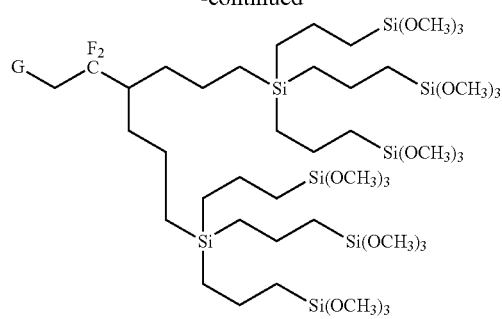
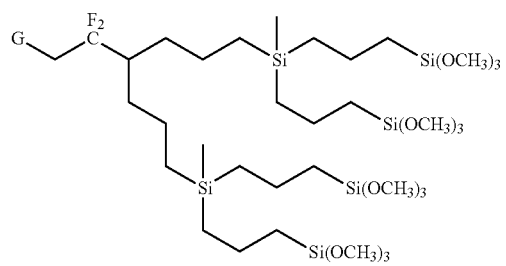
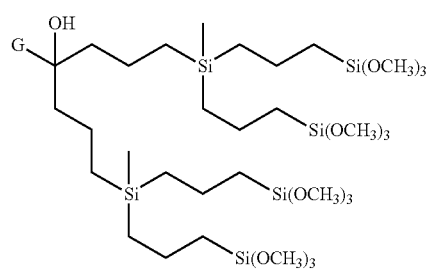
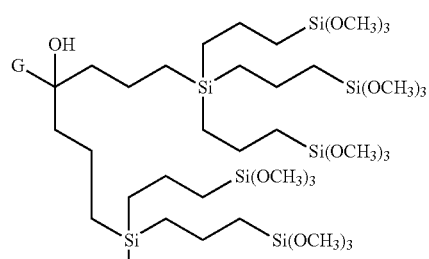
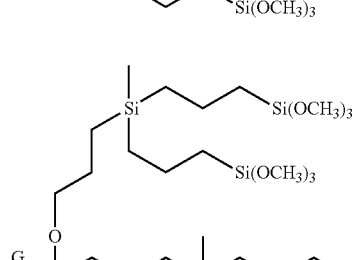
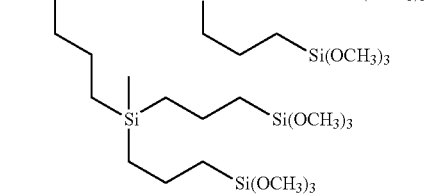
14
-continued
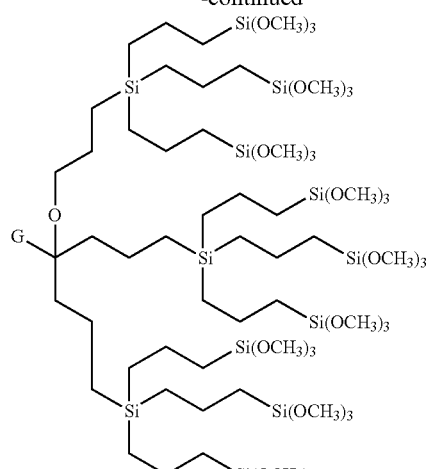
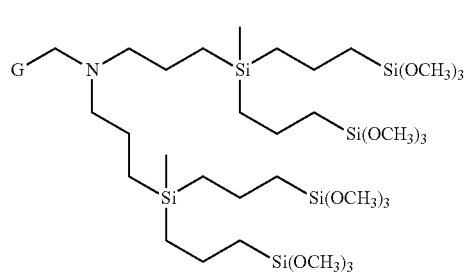
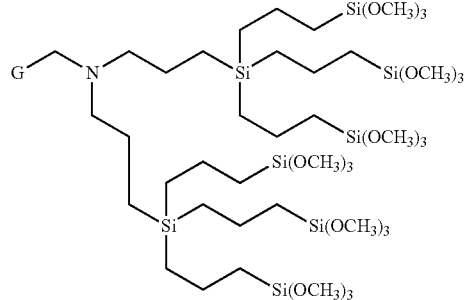
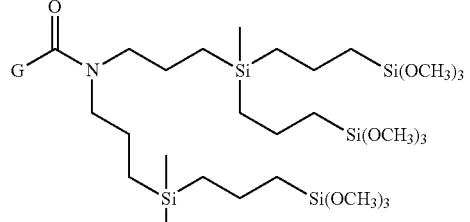
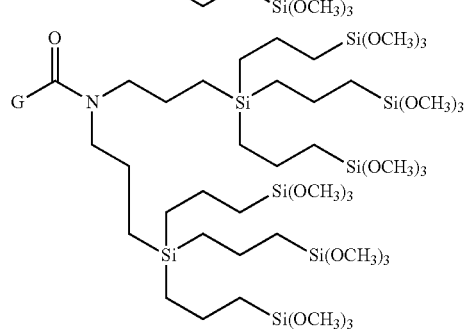

-continued
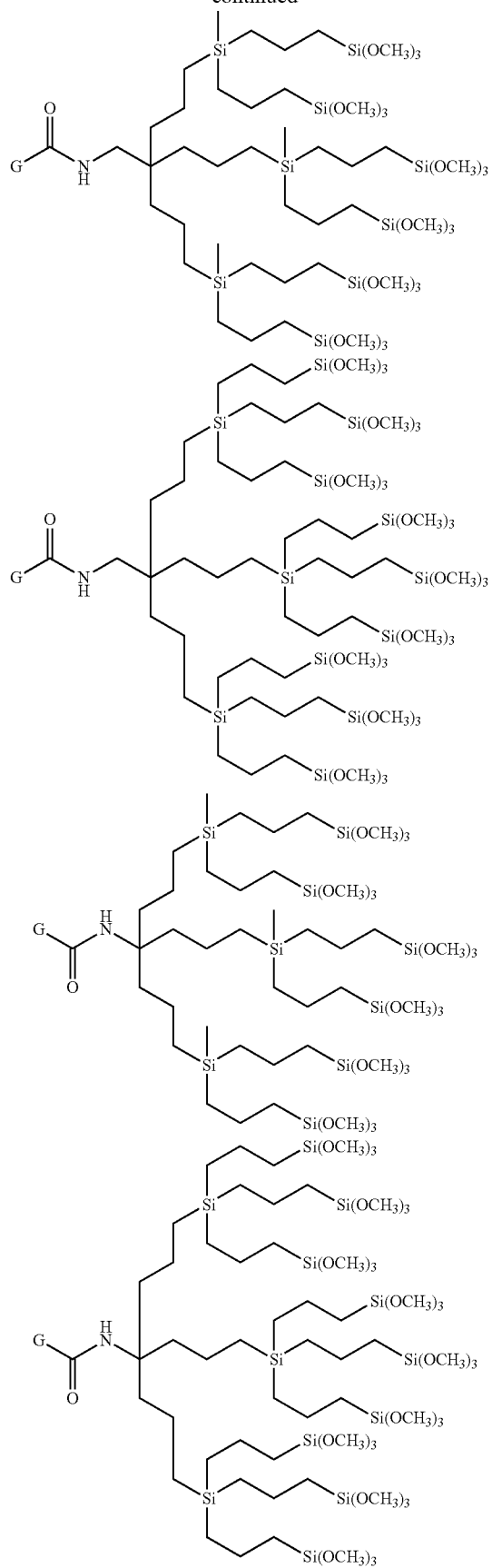
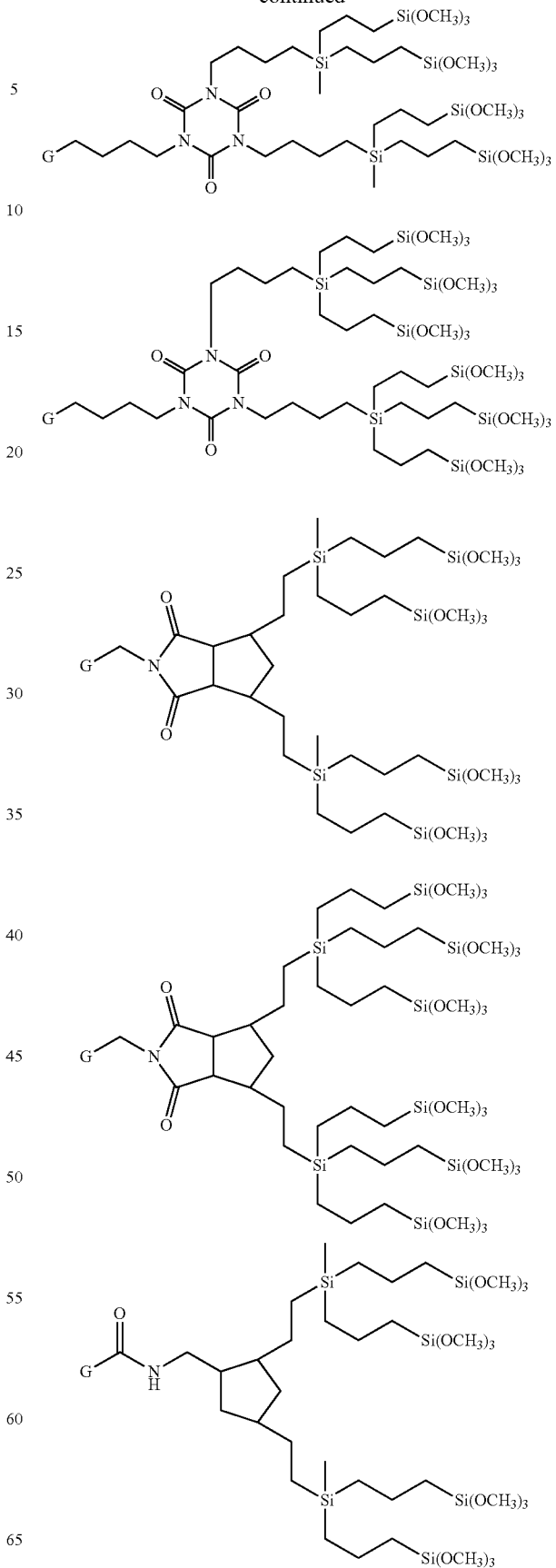

17
-continued
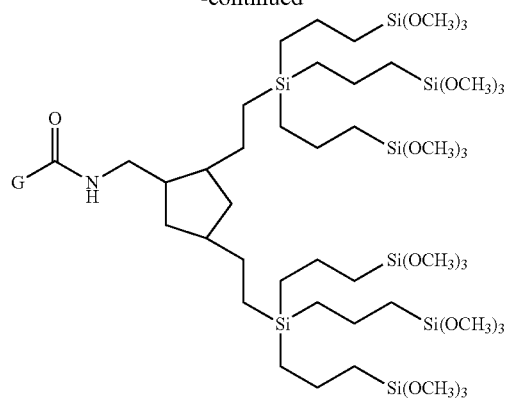
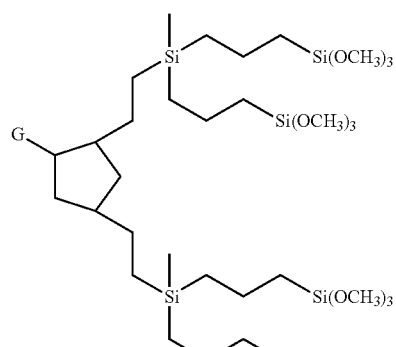
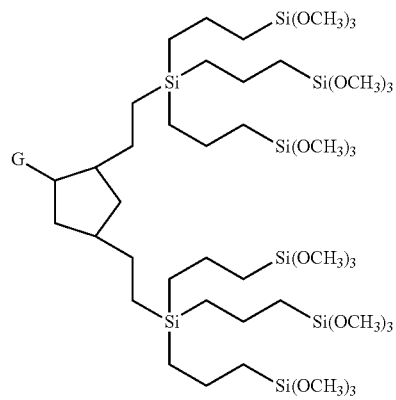
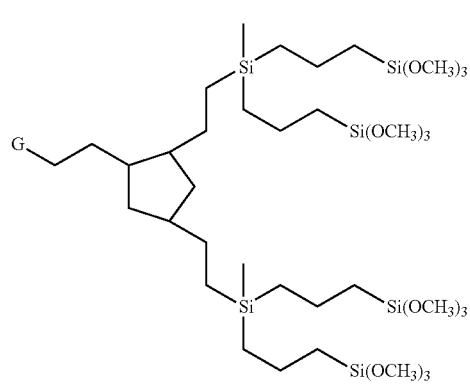
18
-continued
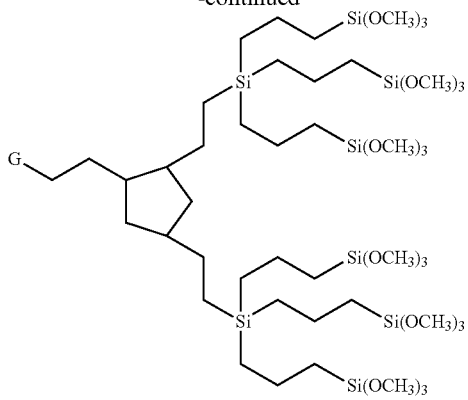
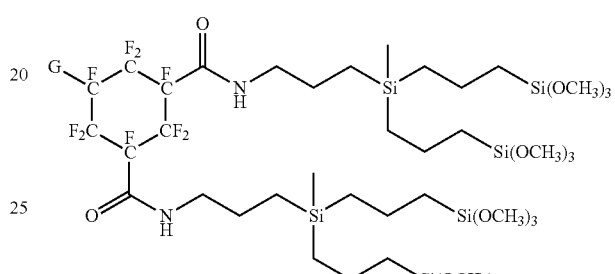
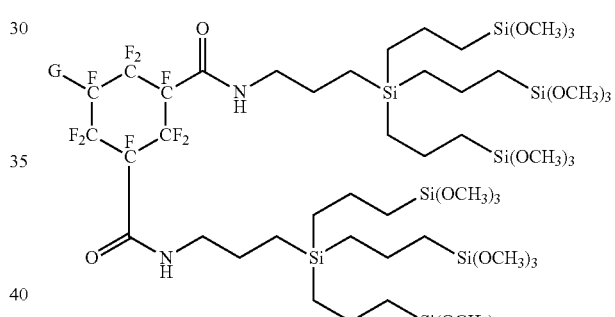
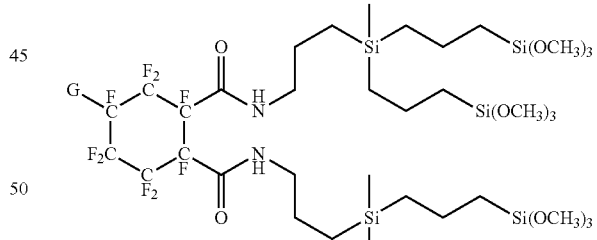
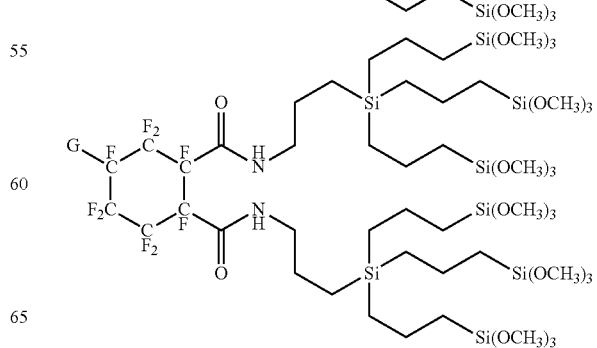

-continued
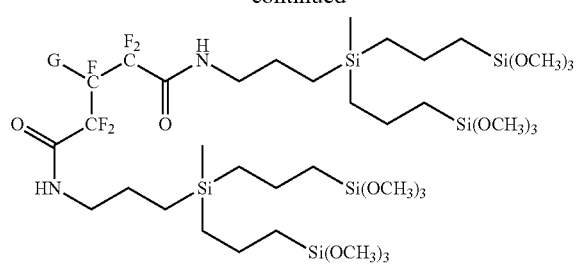
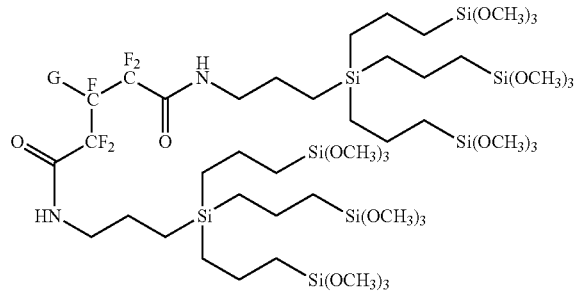
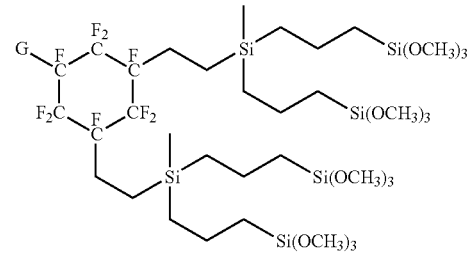
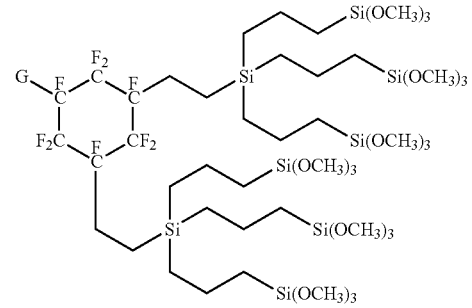
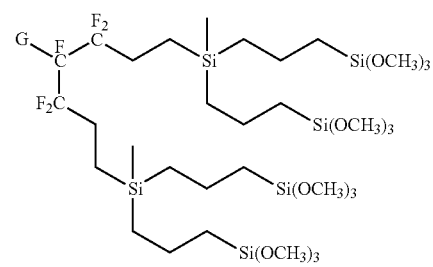
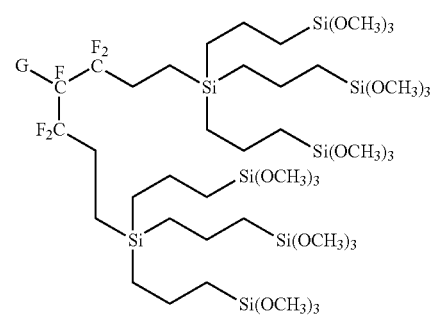
-continued
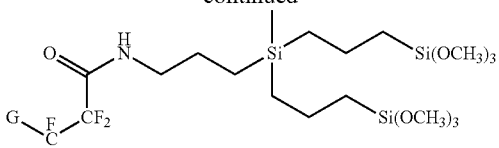
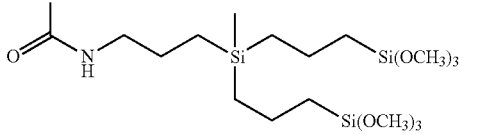
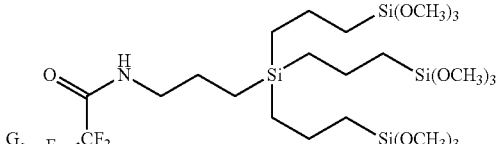
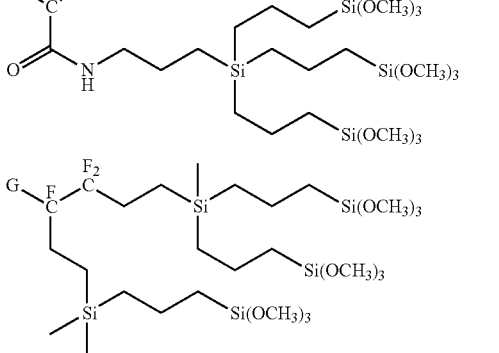
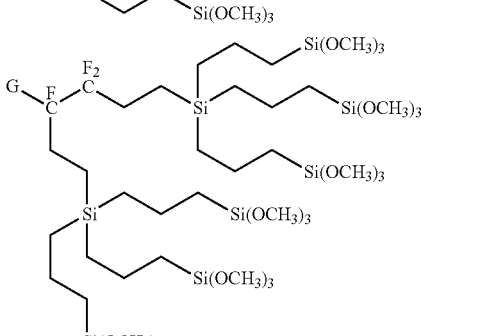
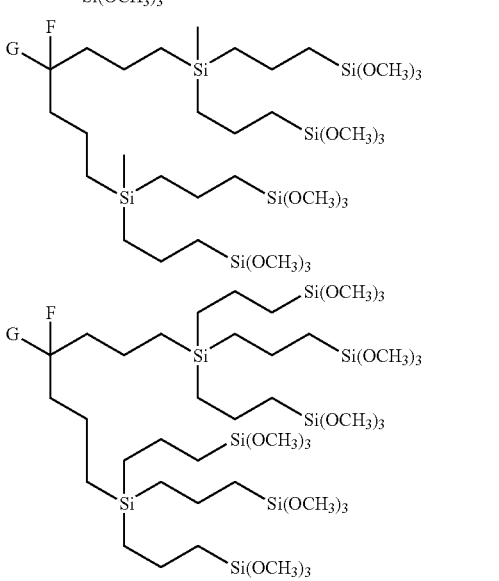

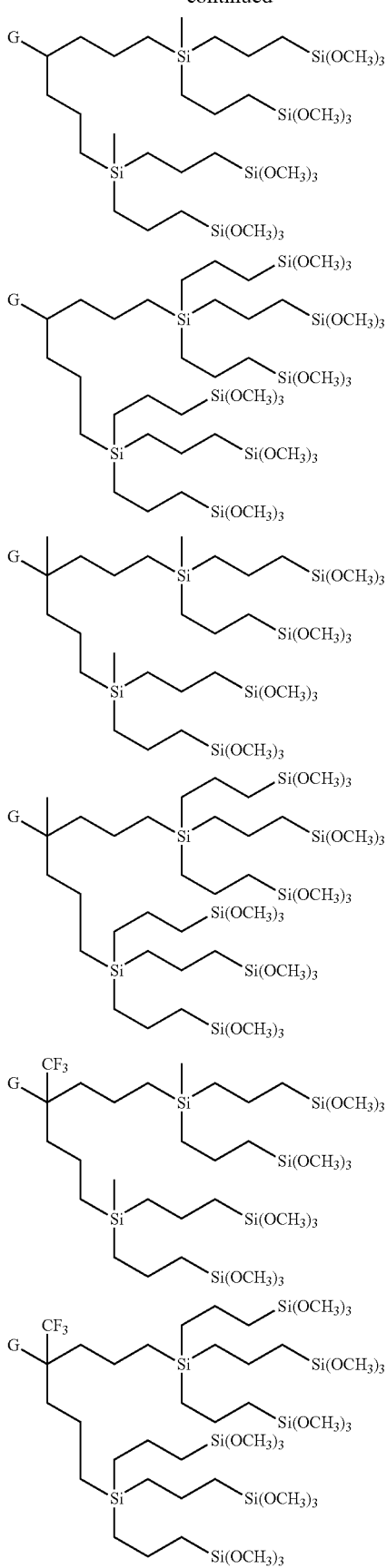

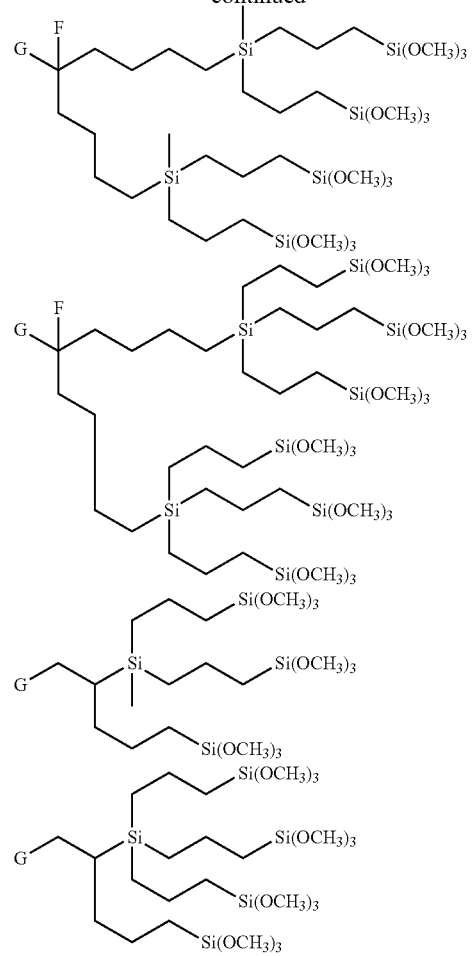

wherein G is a polyfluoropolyether chain, that is, A—O—$(R^{f1}O)_m$—$R^{f2}$— (wherein A is a $C_{1-20}$ perfluoroalkyl group). A preferred embodiment of G is a combination of the above preferred $A^1$, $(R^{f1}O)_m$ and $R^{f2}$.

(Method for Producing Compound (1))

The compound (1) may be produced, for example, by a method of subjecting compound (2) and $HSi(R^{31})_{3-g}(R^{32})_g$ to hydrosilylation.

$$A^{10}-O-(R^{f1}O)_m-A^{20} \quad (2)$$

wherein $A^{10}$ is a $C_{1-20}$ perfluoroalkyl group, group (g4-1), group (g4-2) or group (g4-3), and $A^{20}$ is group (g4-1), group (g4-2) or group (g4-3).

$$-Q^1[-C(R^{110})_b(R^{12})_{3-b}]_a \quad (g4\text{-}1)$$

$$-Q^1[-N(R^{110})_2]_a \quad (g4\text{-}2)$$

$$-Q^1[-Z(R^{110})_n]_a \quad (g4\text{-}3)$$

wherein $R^{110}$ is group (g5), and when a is at least 2, the a $[-C(R^{110})_b(R^{12})_{3-b}]$ may be the same or different, the a $[-N(R^{110})_2]$ may be the same or different, the a $[-Z(R^{110})_n]$ may be the same or different, and a plurality of $R^{110}$ may be the same or different.

$$-Q^2-Si(R^{210})_c(R^{22})_d(R^{23})_e \quad (g5)$$

wherein $R^{210}$ is group (g6), and in at least one $R^{110}$ among a plurality of $R^{110}$ in each of $A^{10}$ and $A^{20}$, c is 2 or 3, and when c is at least 2, the c $R^{210}$ may be the same or different.

$$-Q^{30}-CH=CH_2 \quad (g6)$$

wherein $Q^{30}$ is a single bond or a bivalent organic group.

$(R^{f1}O)_m$, $Q^1$, Z, $R^{12}$, a, b, n, $Q^2$, $R^{22}$, $R^{23}$, c, d and e are the same as $(R^{f1}O)_m$, $Q^1$, Z, $R^{12}$, a, b, n, $Q^2$, $R^{22}$, $R^{23}$, c, d and e as described for the compound (1), and the preferred embodiments are also the same.

$A^{10}$ is, in that the resulting surface layer will be more excellent in lubricity and abrasion resistance, preferably a $C_{1-20}$ perfluoroalkyl group.

The number of carbon atoms in the perfluoroalkyl group as $A^{10}$ is, in that the resulting surface layer will be more excellent in lubricity and abrasion resistance, preferably from 1 to 10, more preferably from 1 to 6, particularly preferably from 1 to 3.

$Q^{30}$ may have the bond B.

The organic group as $Q^{30}$ is, in that the resulting surface layer will be more excellent in light resistance and chemical resistance, preferably a hydrocarbon group, or a combination of a hydrocarbon group and the bond B, particularly preferably a hydrocarbon group. The hydrocarbon group is preferably a saturated aliphatic hydrocarbon group, an aromatic hydrocarbon group or a combination thereof, particularly preferably an alkylene group. The number of carbon atoms in $Q^{30}$ is, in that the resulting surface layer will be more excellent in light resistance and chemical resistance, preferably from 1 to 8, more preferably from 2 to 4, particularly preferably from 1 to 2.

$Q^{30}$ is, in that the compound (2) is easily produced and the resulting surface layer will be more excellent in abrasion resistance, light resistance and chemical resistance, preferably a single bond or a $C_{1-4}$ alkylene group, particularly preferably a single bond or a $C_{1-2}$ alkylene group.

$Q^{30}$—CH=$CH_2$ becomes $Q^3$ in the group (g3) after the hydrosilylation.

(Method for Producing Compound (2))

(i) The compound (2) may be produced, for example, as follows.

Compound (4) and a Grignard reagent ($CH_2$=CH—$Q^{30}$—MgBr) are reacted to obtain compound (2a).

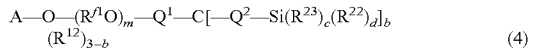

(4)

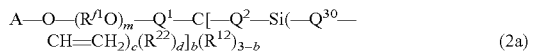

(2a)

wherein A is a $C_{1-20}$ perfluoroalkyl group.

$(R^{f1}O)_m$, $Q^1$, $R^{12}$, b, $Q^2$, $R^{22}$, $R^{23}$, c, d and $Q^{30}$ are the same as $(R^{f1}O)_m$, $Q^1$, $R^{12}$, b, $Q^2$, $R^{22}$, $R^{23}$, c, d and $Q^{30}$ as described for the compounds (1) and (2), and the preferred embodiments are also the same.

The compound (4) may be produced, for example, by the method disclosed in Patent Document 1 (b=3), JP-A-2015-199906 (b=2, $R^{12}$=hydroxy group), or JP-A-2016-204656 (b=3).

(ii) Further, the compound (2) may be produced, for example, as follows.

Compound (6) and $CH_2$=CH—Si($R^{23}$)$_c$$R^{22}$$_d$ are reacted to obtain compound (7).

(6)

(7)

The compound (7) and a Grignard reagent ($CH_2$=CH—$Q^{30}$—MgBr) are reacted to obtain compound (2b).

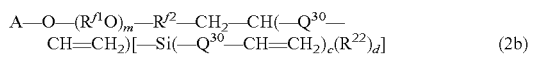

(2b)

wherein A is a $C_{1-20}$ perfluoroalkyl group.

$(R^{f1}O)_m$, $R^{f2}$, $R^{22}$, c, d and $Q^{30}$ are the same as $(R^{f1}O)_m$, $R^{f2}$, $R^{22}$, c, d and $Q^{30}$ as described for the compounds (1) and (2), and the preferred embodiments are also the same.

The compound (6) may be produced, for example, by the method disclosed in WO2009/008380, WO2013/121984 or WO2013/121986.

(iii) Further, the compound (2) may be produced, for example, as follows.

Compound (8) and a Grignard reagent ($CH_2$=CH—$Q^{30}$—MgBr) are reacted to obtain compound (2c).

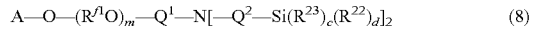

(8)

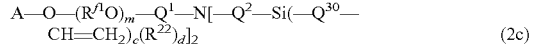

(2c)

wherein A is a $C_{1-20}$ perfluoroalkyl group.

$(R^{f1}O)_m$, $Q^1$, $Q^2$, $R^{22}$, $R^{23}$, c, d and $Q^{30}$ are the same as $(R^{f1}O)_m$, $Q^1$, $Q^2$, $R^{22}$, $R^{23}$, c, d and $Q^{30}$ as described for the compounds (1) and (2), and the preferred embodiments are also the same.

The compound (8) may be produced, for example, by the method disclosed in Patent Document 2.

The above-described compound (1) is capable of forming a surface layer excellent in fingerprint stain removability, abrasion resistance and light resistance, from the following reasons.

The compound (1), which has $(R^{f1}O)_m$, has a high fluorine atom content. Therefore, the compound (1) is capable of forming a surface layer excellent in abrasion resistance and fingerprint stain removability.

The compound (1) has at least two $R^{11}$ bonded to a carbon atom or a nitrogen atom, and in at least one $R^{11}$ among a plurality of $R^{11}$ (that is, a plurality of $Q^2$—Si($R^{21}$)$_c$($R^{22}$)$_d$($R^{23}$)$_e$), c is 2 or 3. Thus, more than one hydrolyzable silyl groups are introduced via two-stage branches i.e. a branch by a carbon atom or a nitrogen atom at the terminal and a subsequent branch by a silicon atom. Accordingly, it is possible to form a surface layer excellent in fingerprint stain removability and abrasion resistance as before and more excellent in light resistance than ever.

Here, for example, in a case where the compound (1) has the group (g1-1), the compound (1) is considered to have a branch by a carbon atom by —C($R^{11}$)$_b$($R^{12}$)$_{3-b}$ in the group (g1-1). Further, the compound (1) is considered to have a branch by the subsequent silicon atom by —$Q^2$—Si($R^{21}$)$_c$($R^{22}$)$_d$($R^{23}$)$_e$ in $R^{11}$. The same applies to a case where the compound (1) has the group (g1-2) or the group (g1-3), or a case where two or more groups of at least one type selected from the groups (g1-1) to (g1-3).

The reason why a surface layer excellent in fingerprint stain removability and abrasion resistance as before and more excellent in light resistance than ever can be formed by the compound (1) having a branch by a carbon atom or a nitrogen atom and a branch by the subsequent silicon atom, the following reason is considered.

A surface layer excellent in abrasion resistance can be formed by a fluorinated ether compound having a C—C bond branched from a carbon atom, since the C—C bond branched from the carbon atom is strong. However, the fluorinated ether compound having the C—C bond branched from a carbon atom gradually undergoes oxidative destruction when exposed to sunlight in air for a long period of time, and is complicatedly decomposed by a hydrogen atom being withdrawn by radicals for example at a methine structure moiety. Even when the branched moiety by the carbon atom is a quaternary carbon atom, the carbon radical formed by cleavage at the C—C bond is stable, originating from which the compound is decomposed. The branch by a nitrogen atom is the same as the branch by the carbon atom.

It is considered that in one molecule, by introducing the branch by a silicon atom subsequent to the branch by the carbon atom or the nitrogen atom, the Si—C bond (Si—C bond branched from the silicon atom) considered to be more stable against oxidation than the C—C bond branched from the carbon atom can suppress oxidative destruction and further, by the interaction between the Si—C bond branched from the silicon atom and the C—C bond branched from the carbon atom, oxidative destruction at the C—C bond branched from the carbon atom can also be suppressed. It is also considered that by the interaction between the Si—C bond branched from the silicon atom and the C—C bond branched from the carbon atom, the strength of the Si—C bond branched from the silicon atom can also be kept in a favorable state.

Accordingly, by incorporating the two types of branched structures which are chemically and physically strong but are different from each other, into one molecule by the embodiment of the present invention, a surface layer excellent in fingerprint stain removability and abrasion resistance as before and more excellent in light resistance than ever can be formed. Accordingly, a surface layer formed of the compound (1) of the present invention can tolerate a severe evaluation method of conducting light resistance test and further conducting abrasion resistance test.

[Fluorinated Ether Composition]

The fluorinated ether composition of the present invention (hereinafter sometimes referred to as "the present composition") comprises at least one type of the compound (1) and other fluorinated ether compound.

As other fluorinated ether compound, a fluorinated ether compound formed as a by-product during production of the compound (1) (hereinafter sometimes referred to as "by-product fluorinated ether compound") and a known fluorinated ether compound used in the same applications as the compound (1) may, for example, be mentioned.

Other fluorinated ether compound is preferably one unlikely to impair the properties of the compound (1).

As the by-product fluorinated ether compound, unreacted compounds (2), (4), (6), (7) and the like, and fluorinated ether compounds formed through isomerization of some of the allyl groups into an inner olefin accompanying hydrosilylation during the production of the compound (1) may, for example, be mentioned.

As the known fluorinated ether compound, a commercially available fluorinated ether compound may, for example, be mentioned. In a case where the present composition contains a known fluorinated ether compound, it may have new effects such as compensation for the properties of the compound (1).

In the present composition, the content of the compound (1) is preferably at least 60 mass % and less than 100 mass %, more preferably at least 70 mass % and less than 100 mass %, particularly preferably at least 80 mass % and less than 100 mass %, to the total amount of the compound (1) and other fluorinated ether compound.

The total content of the compound (1) and other fluorinated ether compound in the present composition is preferably from 80 to 100 mass %, particularly preferably from 85 to 100 mass % to the present composition.

When the content of the compound (1) and the content of other fluorinated ether compound are within the above ranges, the surface layer will be more excellent in initial water/oil repellency, abrasion resistance, fingerprint stain removability, light resistance and chemical resistance.

The present composition may contain a component other than the compound (1) and other fluorinated ether compound within a range not to impair the effects of the present invention.

Other component may, for example, be a by-product formed during production of the compound (1) or the known fluorinated ether compound (excluding the by-product fluorinated ether compound) or a compound inevitable in production such as an unreacted raw material.

Further, additives such as an acid catalyst or a basic catalyst to promote hydrolysis and condensation reaction of the hydrolyzable silyl group may be mentioned. The acid catalyst may, for example, be hydrochloric acid, nitric acid, acetic acid, sulfuric acid, phosphoric acid, sulfonic acid, methanesulfonic acid or p-toluenesulfonic acid. The basic catalyst may, for example, be sodium hydroxide, potassium hydroxide or ammonia.

The content of other component is preferably from 0 to 10 mass %, particularly preferably from 0 to 1 mass % to the present composition.

[Coating Liquid]

The coating liquid of the present invention (hereinafter sometimes referred to as "the present coating liquid") comprises the compound (1) or the present composition, and a liquid medium. The present coating liquid may be a solution or a dispersion.

The liquid medium is preferably an organic solvent. The organic solvent may be a fluorinated organic solvent, may be a non-fluorinated organic solvent, or may contain both solvents.

The fluorinated organic solvent may, for example, be a fluorinated alkane, a fluorinated aromatic compound, a fluoroalkyl ether, a fluorinated alkylamine or a fluoroalcohol.

The fluorinated alkane is preferably a $C_{4-8}$ compound. Commercially available products may, for example, be $C_6F_{13}H$ (manufactured by AGC Inc., ASAHIKLIN (registered trademark) AC-2000), $C_6F_{13}C_2H_5$ (manufactured by AGC Inc., ASAHIKLIN (registered trademark) AC-6000), and $C_2F_5CHFCHFCF_3$ (manufactured by Chemours, Vertrel (registered trademark) XF).

The fluorinated aromatic compound may, for example, be hexafluorobenzene, trifluoromethylbenzene, perfluorotoluene or bis(trifluoromethyl)benzene.

The fluoroalkyl ether is preferably a $C_{4-12}$ compound. Commercially available products may, for example, be $CF_3CH_2OCF_2CF_2H$ (manufactured by AGC Inc., ASAHIKLIN (registered trademark) AE-3000), $C_4F_9OCH_3$ (manufactured by 3M, Novec (registered trademark) 7100), $C_4F_9OC_2H_5$ (manufactured by 3M, Novec (registered trademark) 7200), and $C_2F_5CF(OCH_3)C_3F_7$ (manufactured by 3M, Novec (registered trademark) 7300).

The fluorinated alkylamine may, for example, be perfluorotripropylamine or perfluorotributylamine, The fluoroalcohol may, for example, be 2,2,3,3-tetrafluoropropanol, 2,2,2-trifluoroethanol or hexafluoroisopropanol.

The non-fluorinated organic solvent is preferably a compound consisting solely of hydrogen atoms and carbon atoms, or a compound consisting solely of hydrogen atoms, carbon atoms and oxygen atoms, and may be a hydrocarbon, an alcohol, a ketone, an ether, or an ester.

The liquid medium may be a mixed medium having two or more types mixed.

The content of the compound (1) or the present composition is preferably from 0.001 to 10 mass %, particularly preferably from 0.01 to 1 mass % to the present coating liquid.

The content of the liquid medium is preferably from 90 to 99.999 mass %, particularly preferably from 99 to 99.99 mass % in the present coating liquid.

[Article]

The article of the present invention (hereinafter sometimes referred to as "the present article") comprises a substrate and a surface layer formed of the compound (1) or the present composition on a surface of the substrate.

The surface layer contains the compound (1) in a state where some or all of hydrolyzable silyl groups in the compound (1) are hydrolyzed and subjected to dehydration condensation reaction.

The thickness of the surface layer is preferably from 1 to 100 nm, particularly preferably from 1 to 50 nm. When the thickness of the surface layer is at least 1 nm, the effect by the surface treatment is likely to be sufficiently obtained. When the thickness of the surface layer is at most 100 nm, utilization efficiency will be high. The thickness of the surface layer can be calculated from an oscillation period of an interference pattern of reflected X-ray, obtained by X-ray reflectance method using an X-ray diffractometer for thin film analysis (manufactured by Rigaku Corporation, ATX-G).

The substrate may be a substrate which is desired to have water/oil repellency imparted. The material of the substrate may, for example, be a metal, a resin, glass, sapphire, ceramic, stone or a composite material thereof. The glass may be chemically tempered. The substrate may have a primer film such as a $SiO_2$ film formed on its surface.

As the substrate, a substrate for a touch panel, a substrate for display or a spectacle lens is preferred, and a substrate for a touch panel is particularly preferred. As the material of a substrate for a touch panel, glass or a transparent resin is preferred.

[Method for Producing Article]

The present article may be produced, for example, by the following method.

A method of treating the surface of a substrate by dry coating method using the compound (1) or the present composition, to form a surface layer formed of the compound (1) or the present composition on the surface of the substrate.

A method of applying the present coating liquid to the surface of a substrate by wet coating method, followed by drying to form a surface layer formed of the compound (1) or the present composition on the surface of the substrate.

As the dry coating method, a method such as vacuum deposition, CVD or sputtering may be mentioned. As the dry coating method, with a view to suppressing decomposition of the compound (1) and from the viewpoint of simplicity of apparatus, vacuum deposition method is preferred. At the time of vacuum deposition, a pelletized material having a metal porous product of iron, steel of the like impregnated with the compound (1) or the present composition may be used. A pelletized material impregnated with the compound (1) or the present composition, obtained by impregnating a metal porous product of iron, steel of the like with the present coating liquid and drying the liquid medium, may be used.

The wet coating method may, for example, be a spin coating method, a wipe coating method, a spray coating method, a squeegee coating method, a dip coating method, a die coating method, an ink-jet method, a flow coating method, a roll coating method, a casting method, a Langmuir-Blodgett method, or a gravure coating method.

EXAMPLES

Now, the present invention will be described in further detail with reference to Examples, but the present invention is not limited to these Examples. Hereinafter, "%" is "mass %" unless otherwise specified. Ex. 4 and 5 are Examples of the present invention, and Ex. 6 is a Comparative Example.

Ex. 1

Ex. 1-1

Compound (3-1) was obtained in accordance with the method disclosed in Ex. 11-1 to 11-2 in WO2017/038830.

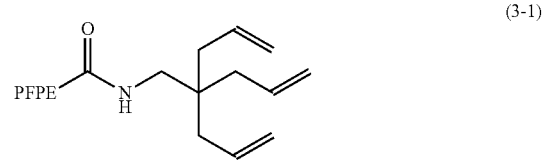

(3-1)

PFPE = $CF_3-O-(CF_2CF_2O-CF_2CF_2CF_2CF_2O)_xCF_2CF_2O-CF_2CF_2CF_2-$

Mean value of x: 13, number average molecular weight of compound (3-1): 4,800.

Ex. 1-2

Into a 50 mL eggplant flask, 10 g of compound (3-1) obtained in Ex. 1-1, 0.9 g of methyldimethoxysilane, 0.009 g of aniline, 10 g of $C_6F_{13}C_2H_5$ (manufactured by AGC Inc., ASAHIKLIN (registered trademark) AC-6000), and 0.033 g of a platinum/divinyltetramethyldisiloxane complex were put, followed by stirring at 25° C. overnight. The mixture was concentrated to obtain 10 g of compound (4-1).

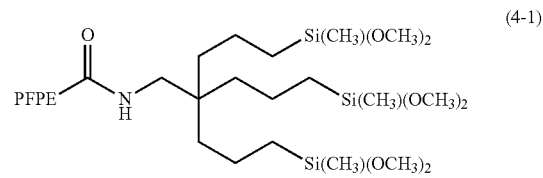

(4-1)

PFPE = $CF_3-O-(CF_2CF_2O-CF_2CF_2CF_2CF_2O)_xCF_2CF_2O-CF_2CF_2CF_2-$

NMR spectrum of compound (4-1):
$^1$H-NMR (300.4 MHz, solvent: $CDCl_3$, reference: tetramethylsilane (TMS)) δ (ppm): 3.9(18H), 3.3(2H), 1.1 to 2.0(12H), 0.5 to 1.0(6H), 0(9H).
$^{19}$F-NMR (282.7 MHz, solvent: $CDCl_3$, reference: $C_6F_6$) δ (ppm): −55.2(3F), −82.1(54F), −88.1(54F), −90.2(2F), −119.6(2F), −125.4(52F), −126.2(2F).

Mean value of x: 13.

Ex. 1-3

Into a 200 mL three-necked flask, the system in which was replaced with nitrogen, 30 mL of a 0.7 mol/L ether solution of allyl magnesium bromide and 30 mL of dichloropentafloropropane (manufactured by AGC Inc., AK-225) were put, followed by stirring at 25° C. 10 g of the compound (4-1) obtained in Ex. 1-2 diluted with 50 mL of AK-225 was put into the three-necked flask little by little, followed by stirring overnight. The obtained crude product was quenched with a 1 mol/L hydrochloric acid aqueous solution, followed by liquid separation with AK-225, and the resulting organic layer was concentrated and purified by silica gel column chromatography to obtain 9.3 g of compound (2-1).

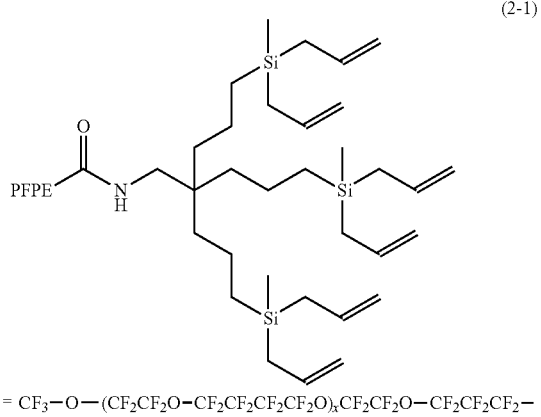

(2-1)

PFPE = $CF_3-O-(CF_2CF_2O-CF_2CF_2CF_2CF_2O)_xCF_2CF_2O-CF_2CF_2CF_2-$

NMR spectrum of compound (2-1):
$^1$H-NMR (300.4 MHz, solvent: CDCl$_3$, reference: TMS) δ (ppm): 6.0(6H), 5.0(12H), 3.3(2H), 1.1 to 2.0(24H), 0.5 to 1.0(6H), 0.0(9H).
$^{19}$F-NMR (282.7 MHz, solvent: CDCl$_3$, reference: C$_6$F$_6$) δ (ppm): −55.2(3F), −82.1(54F), −88.1(54F), −90.2(2F), −119.6(2F), −125.4(52F), −126.2(2F).
Mean value of x: 13.

Ex. 1-4

Into a 50 mL eggplant flask, 9.0 g of the compound (2-1) obtained in Ex. 1-3, 2.20 g of trimethoxysilane, 0.0220 g of aniline, 9.0 g of AC-6000 and 0.03 g of a platinum/divinyltetramethyldisiloxane complex were put, followed by stirring at 25° C. overnight. The mixture was concentrated to obtain 9.0 g of compound (1-1).

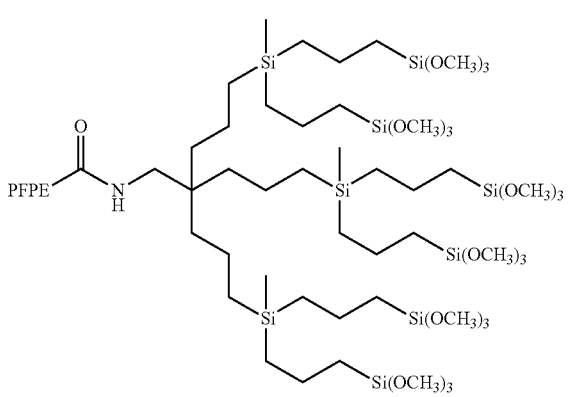

(1-1)

PFPE = $CF_3-O-(CF_2CF_2O-CF_2CF_2CF_2CF_2O)_xCF_2CF_2O-CF_2CF_2CF_2-$

NMR spectrum of compound (1-1):
$^1$H-NMR (300.4 MHz, solvent: CDCl$_3$, reference: TMS) δ (ppm): 3.9(18H), 3.4(2H), 1.1 to 2.0(24H), 0.5 to 1.0 (30H), 0.0(9H).
$^{19}$F-NMR (282.7 MHz, solvent: CDCl$_3$, reference: C$_6$F$_6$) δ (ppm): −55.2(3F), −82.1(54F), −88.1(54F), −90.2(2F), −119.6(2F), −125.4(52F), −126.2(2F).
Mean value of x: 13.

Ex. 2

Ex. 2-1

Compound (5-1) was obtained in accordance with the method disclosed in Ex. 11-1 to 11-3 in WO2013/121984.

$$CF_3-O-(CF_2CF_2O-CF_2CF_2CF_2CF_2O)_xCF_2$$
$$CF_2O-CF_2CF_2CF_2-CF_2OC(O)CF(CF_3)$$
$$OCF_2CF_2CF_3 \quad (5\text{-}1)$$

Mean value of unit number x: 13, number average molecular weight of compound (5-1): 5,050.

Ex. 2-2

Into a 500 mL eggplant flask light-shielded with an aluminum foil, 5.8 g of sodium pyrithione and 100 mL of 1,3-bistrifluoromethylbenzene (manufactured by AGC SEIMI CHEMICAL CO., LTD., SR-solvent) were put, followed by stirring under cooling in an ice bath. Then, 50.0 g of the compound (5-1) obtained in Ex. 2-1 was slowly added, followed by stirring for 2 hours under cooling in an ice bath. Then, 12.0 g of iodine and 1.8 g of 2,2-azobis(2-methylbutylonitrile) (manufactured by Wako Pure Chemical Industries, Ltd., V-59) were put, the aluminum foil for light shielding was removed, followed by stirring at 85° C. overnight. The temperature was returned to 25° C., methanol was added, followed by sufficient stirring, and AC-6000 was put for separation into two layers, the lower layer was recovered, and the solvent was distilled off. The obtained crude product was purified by silica gel column chromatography to obtain 39.8 g of compound (6-1).

$$CF_3-O-(CF_2CF_2O-CF_2CF_2CF_2CF_2O)_x$$
$$CF_2CF_2O-CF_2CF_2CF_2-I \quad (6\text{-}1)$$

NMR spectrum of compound (6-1):
$^{19}$F-NMR (282.7 MHz, solvent: CDCl$_3$, reference: C$_6$F$_6$) δ (ppm): −55(3F), −58(2F), −83(50F), −88(52F), −90(2F), −116(2F), −125(52F).
Mean value of x: 13.

Ex. 2-3

Into a 50 mL eggplant flask, 10 g of the compound (6-1) obtained in Ex. 2-2, 2.0 g of dichloromethylvinylsilane (manufactured by TCI), 30 mL of ClCF$_2$CFClCF$_2$OCF$_2$CF$_2$Cl (CFE-419) and 36 mg of PERBUTYL PV (manufactured by NOF CORPORATION) were put, followed by stirring at 65° C. overnight. The reaction temperature was returned to 25° C., and the solvent was distilled off to obtain 9.8 g of compound (7-1).

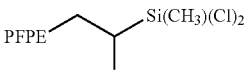

(7-1)

PFPE = $CF_3-O-(CF_2CF_2O-CF_2CF_2CF_2CF_2O)_xCF_2CF_2O-CF_2CF_2CF_2-$

NMR spectrum of compound (7-1):
¹H-NMR (300.4 MHz, solvent: CDCl₃, reference: TMS) δ (ppm): 3.7 to 3.5(1H), 3.3 to 3.1(1H), 2.8-2.6(1H), 1.3 (3H).
¹⁹F-NMR (282.7 MHz, solvent: CDCl₃, reference: C₆F₆) δ (ppm): −55(3F), −83(50F), −88(52F), −90(2F), −110 to −117(2F), −125(52F).
Mean value of x: 13.

Ex. 2-4

Into a 200 mL three-necked flask, the system in which was replaced with nitrogen, 13.7 mL of a 0.7 mol/L ether solution of allyl magnesium bromide and 45 mL of AK-225 were put, followed by stirring at 25° C. 9.5 g of the compound (7-1) obtained in Ex. 2-3 diluted with 40 mL of AK-225 was put into the three-necked flask little by little, followed by stirring overnight. The obtained crude product was quenched with a 1 mol/L hydrochloric acid aqueous solution, followed by liquid separation with AK-225, and the resulting organic layer was concentrated and purified by silica gel column chromatography to obtain 9.0 g of compound (2-2).

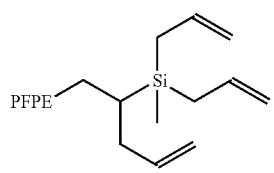

(2-2)

PFPE = CF₃−O−(CF₂CF₂O−CF₂CF₂CF₂CF₂O)ₓCF₂CF₂O−CF₂CF₂CF₂−

NMR spectrum of compound (2-2):
¹H-NMR (300.4 MHz, solvent: CDCl₃, reference: TMS) δ (ppm): 6.0 to 5.8(3H), 5.3 to 4.6(6H), 2.8 to 2.2(4H), 2.0 to 1.7(4H), 1.4 to 1.3(1H), 0.4 to 0.2(3H).
¹⁹F-NMR (282.7 MHz, solvent: CDCl₃, reference: C₆F₆) δ (ppm): −55(3F), −83(50F), −88(52F), −90(2F), −112 to −118(2F), −125(52F).
Mean value of x: 13.

Ex. 2-5

Into a 50 mL eggplant flask, 1 g of the compound (2-2) obtained in Ex. 2-4, 0.10 g of trimethoxysilane, 0.0010 g of aniline, 1 g of AC-6000 and 0.0033 g of a platinum/divinyltetramethyldisiloxane complex were put, followed by stirring at 25° C. overnight. The mixture was concentrated to obtain 1 g of compound (1-2).

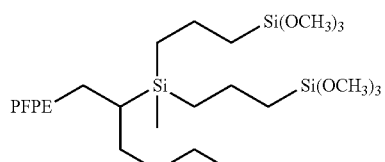

(1-2)

PFPE = CF₃−O−(CF₂CF₂O−CF₂CF₂CF₂CF₂O)ₓCF₂CF₂O−CF₂CF₂CF₂−

¹H-NMR (300.4 MHz, solvent: CDCl₃, reference: TMS) δ (ppm): 3.7 to 3.5(27H), 2.2 to 1.9(2H), 1.6 to 1.3(9H), 0.8 to 0.5(10H), 0.2 to 0(3H).

¹⁹F-NMR (282.7 MHz, solvent: CDCl₃, reference: C₆F₆) δ (ppm): −55(3F), −83(50F), −88(52F), −90(2F), −112 to −117(2F), −125(52F).
Mean value of x: 13.

Ex. 3

Compound (4-2) was obtained in accordance with the method disclosed in Ex. 11-3 in WO2017/038830 using the compound (3-1) obtained in Ex. 1-1.

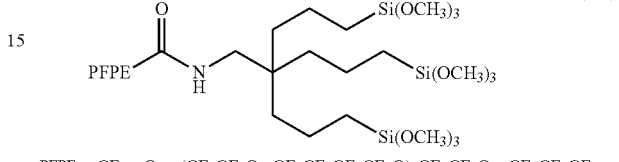

(4-2)

PFPE = CF₃−O−(CF₂CF₂O−CF₂CF₂CF₂CF₂O)ₓCF₂CF₂O−CF₂CF₂CF₂−

Mean value of x: 13, number average molecular weight of compound (4-2): 5,400.

Ex. 4

Compound (1-3) was prepared in the same manner as in Ex. 2-3 except that trichlorovinylsilane was used instead of dichloromethylvinylsilane.

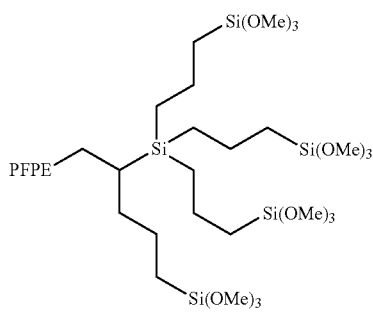

(1-3)

Ex. 5-1

Into a 200 mL eggplant flask, 5.02 g of compound (6-0), 6.16 g of triethylamine, 0.080 g of dimethylaminopyridine and 100 mL of tetrahydrofuran were put, followed by stirring in an ice bath. Then, 10.9 g of di-tert-butyl dicarbonate was put, and the temperature of the reaction system was increased to 25° C., followed by stirring for one hour. Liquid separation was conducted with ethyl acetate and water, and the resulting organic solvent layer was concentrated. The obtained crude product was purified by silica gel column chromatography to obtain 7.90 g (yield: 87%) of compound (6-2).

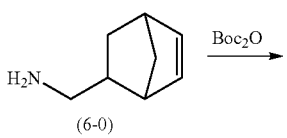

(6-0)

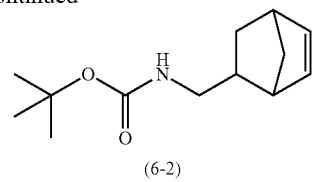

(6-2)

NMR spectrum of compound (6-2):

$^1$H-NMR (300.4 MHz, solvent: CDCl$_3$, reference: tetramethylsilane (TMS)) δ (ppm): 6.1(1H), 5.9(1H), 4.5(1H), 3.2-2.5(5H), 2.2(1H), 1.8(1H), 1.4(9H), 1.2(1H), 0.5(1H).

Ex. 5-2

Into a 1 L autoclave, 7.17 g of the compound (6-2) obtained in Ex. 5-1 and 800 mL of toluene were put, followed by freeze deaeration, and 16 g of ethylene was put until the pressure gauge of the autoclave reached 0.4 MPa [gauge]. A solution having 0.40 g of benzylidene{1,3-bis(2,4,6-trimethylphenyl)-2-imidazolidinylidene}dichloro(tricyclohexylphosphine)ruthenium (Grubbs second-generation catalyst) dissolved in 5 mL of toluene was injected, followed by stirring at 25° C. for 22 hours. The mixture was purified by silica gel column chromatography to obtain 1.1 g (yield: 15%) of compound (6-3).

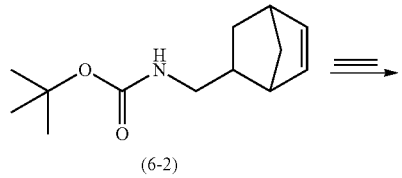

(6-2)

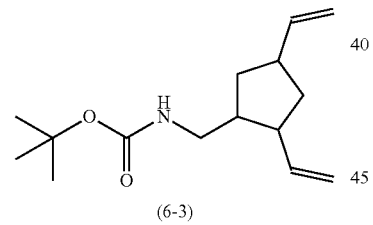

(6-3)

NMR spectrum of compound (6-3):

$^1$H-NMR (300.4 MHz, solvent: CDCl$_3$, reference: TMS) δ (ppm): 5.8(2H), 4.9(4H), 3.1(2H), 2.7(1H), 2.5(1H), 2.2(1H), 2.0(2H), 1.5-1.0(11H).

Ex. 5-3

Into a 200 mL eggplant flask, 1.1 g of the compound (6-3) obtained in Ex. 5-2 and 50 mL of methylene chloride were put, followed by stirring in an ice bath. Then, 1.6 g of trifluoroacetic acid was put, followed by stirring at 25° C. for one hour. Then, 50 mL of a 10% sodium hydroxide aqueous solution was put, followed by stirring. Liquid separation was conducted, and the resulting organic layer was dehydrated over magnesium sulfate, and the magnesium sulfate was removed by filtration. The organic layer was concentrated to obtain 0.58 g (yield: 87%) of compound (6-4).

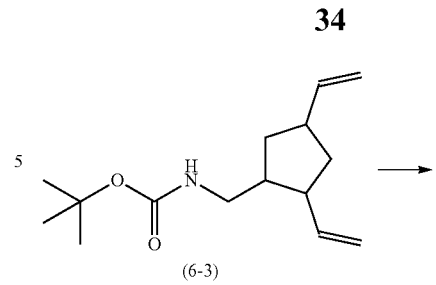

(6-3)

(6-4)

NMR spectrum of compound (6-4):

$^1$H-NMR (300.4 MHz, solvent: CDCl$_3$, reference: TMS) δ (ppm): 5.8(2H), 5.0(4H), 3.6(2H), 3.7(2H), 3.5(2H), 2.2-1.9(3H), 1.4-1.0(2H).

Ex. 5-4

Into a 100 mL eggplant flask, 0.29 g of the compound (6-4) obtained in Ex. 5-3, 5.0 g of compound (3-0) obtained by the method in Ex. 2-3 in WO2013/121984 and 5.1 g of AC-6000 were put, followed by stirring at 60° C. for 2 days. The obtained crude product was purified by silica gel column chromatography to obtain 4.30 g (yield: 89%) of compound (2-11).

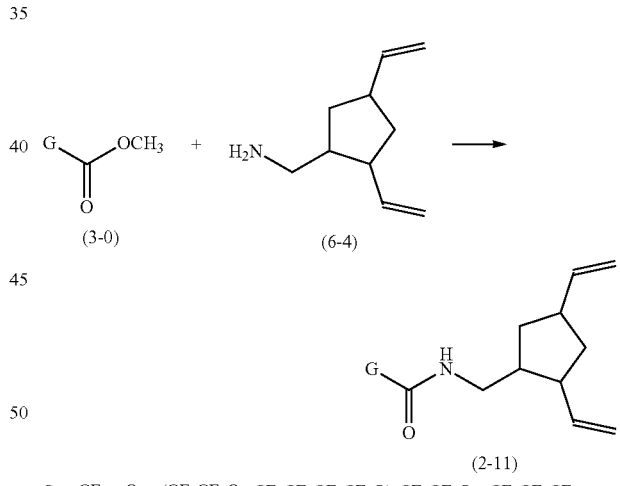

(2-11)

G = CF$_3$—O—(CF$_2$CF$_2$O—CF$_2$CF$_2$CF$_2$CF$_2$O)$_x$CF$_2$CF$_2$O—CF$_2$CF$_2$CF$_2$—

NMR spectrum of compound (2-11):

$^1$H-NMR (300.4 MHz, solvent: CDCl$_3$, reference: TMS) δ (ppm): 5.7(2H), 4.9(4H), 3.4(1H), 3.2(1H), 2.7(1H), 2.5(1H), 2.2(1H), 1.9(2H), 1.4-1.0(2H).

$^{19}$F-NMR (282.7 MHz, solvent: CDCl$_3$, reference: CFCl$_3$) δ (ppm): −56(3F), −83(58F), −88(58F), −91(2F)-120(2F), −126(58F).

Ex. 5-5

Into a 50 mL eggplant flask, 1.1 g of the compound (2-11) obtained in Ex. 5-4, 0.073 g of trimethoxysilane, 0.0001 g of aniline, 1.0 g of AC-6000 and 0.0033 g of a platinum/1,3-divinyl-1,1,3,3-tetramethyldisiloxane complex were put, followed by stirring at 25° C. overnight. The solvent and the like were distilled off under reduced pressure to obtain 1.1 g (yield: 100%) of compound (2-12).

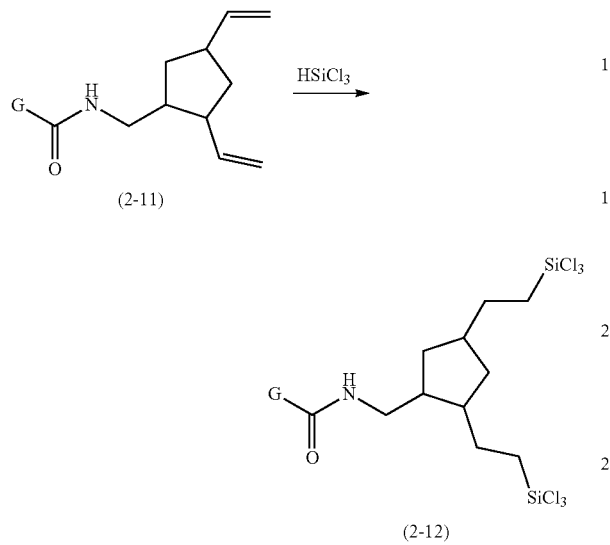

NMR spectrum of compound (2-12):

$^1$H-NMR (300.4 MHz, solvent: CDCl$_3$, reference: TMS) δ (ppm): 3.2(2H), 2.3-1.4(5H), 1.2-0.5(10H).

$^{19}$F-NMR (282.7 MHz, solvent: CDCl$_3$, reference: CFCl$_3$) δ (ppm): −56(3F), −83(58F), −88(58F), −91(2F)-120(2F), −126(58F).

Ex. 5-6

Into a 50 mL three-necked flask, the system in which was replaced with nitrogen, 5 ml of a 0.7 mol/L ether solution of allyl magnesium bromide and 5 mL of dichloropentafluoropropane (manufactured by AGC Inc., AK-225) were put, followed by stirring at 0° C. 1.0 g of the compound (2-12) obtained in Ex. 5-5 diluted with 50 mL of AK-225 was put into the three-necked flask little by little, followed by stirring overnight. The obtained crude product was quenched with a 1 mol/L hydrochloric acid aqueous solution, followed by liquid separation with AK-225, and the resulting organic layer was concentrated and purified by silica gel column chromatography to obtain 0.8 g of compound (2-13).

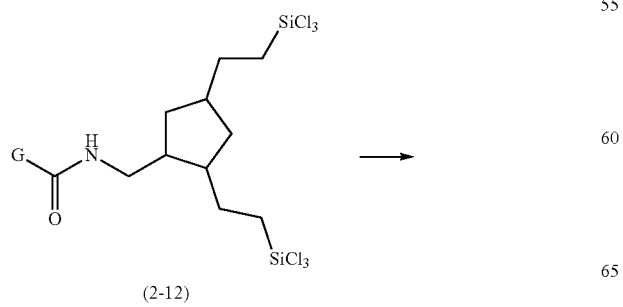

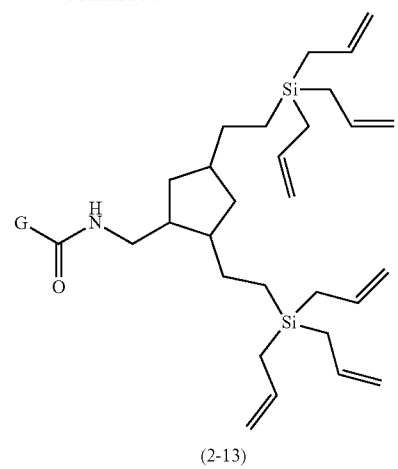

NMR spectrum of compound (2-13):

$^1$H-NMR (300.4 MHz, solvent: CDCl$_3$, reference: TMS) δ (ppm): 6.0(6H), 5.0(12H), 3.2(2H), 2.3-1.1(17H), 1.1-0.5 (10H).

$^{19}$F-NMR (282.7 MHz, solvent: CDCl$_3$, reference: CFCl$_3$) δ (ppm): −56(3F), −83(58F), −88(58F), −91(2F)-120(2F), −126(58F).

Ex. 5-7

Into a 50 mL eggplant flask, 0.8 g of compound (2-13) obtained in Ex. 5-6, 0.20 g of trimethoxysilane, 0.0020 g of aniline, 0.8 g of AC-6000 and 0.003 g of a platinum/divinyltetramethyldisiloxane complex were put, followed by stirring at 25° C. overnight. The mixture was concentrated to obtain 0.80 g of compound (1-4).

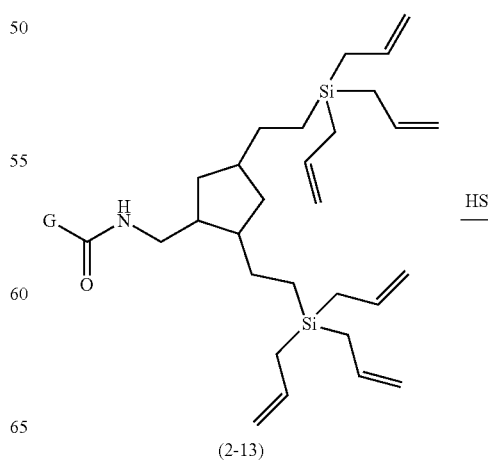

-continued

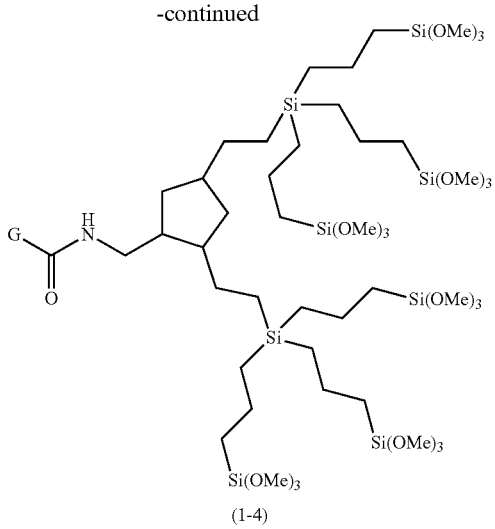

(1-4)

NMR spectrum of compound (1-4):
$^1$H-NMR (300.4 MHz, solvent: CDCl$_3$, reference: TMS) δ (ppm): 3.8-3.2(56H), 2.1-0.5(51H)
$^{19}$F-NMR (282.7 MHz, solvent: CDCl$_3$, reference: CFCl$_3$) δ (ppm): -56(3F), -83(58F), -88(58F), -91(2F)-120(2F), -126(58F).

Ex. 6

Compound (1-5) was prepared in the same manner as in Ex. 5-5 except that dichloromethylvinylsilane was used instead of trichlorovinylsilane.

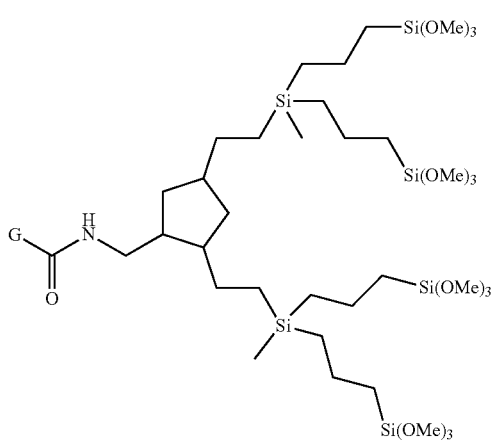

(1-5)

Ex. 7 to 12

Production and Evaluation of Article

Using the compound obtained in each of Ex. 1 to 6, a substrate was surface-treated to obtain an article in each of Ex. 7 to 12. As the surface treatment method, in each Ex., the following dry coating method was employed. As the substrate, chemically tempered glass was used. With respect to the obtained article, evaluations were carried out by the following methods. The results are shown in Table 1.

(Dry Coating Method)
The dry coating was carried out by using a vacuum deposition apparatus (manufactured by ULVAC Co., VTR-350M) (vacuum deposition method). 0.5 g of the compound obtained in each of Ex. 1 to 6 was filled in a boat made of molybdenum in the vacuum deposition apparatus, and inside of the vacuum deposition apparatus was evacuated to a level of at most $1\times10^{-3}$ Pa. The boat having the compound placed therein, was heated at a temperature raising rate of at most 10° C./min, and at the time when the vapor deposition rate by a quartz oscillator film thickness meter exceeded 1 nm/sec, the shutter was opened to initiate film deposition on the surface of a substrate. When the film thickness became about 50 nm, the shutter was closed to terminate film deposition on the surface of the substrate. The substrate on which the compound was deposited, was subjected to heat treatment at 200° C. for 30 minutes, followed by washing with AK-225 to obtain an article having a surface layer on the surface of the substrate.

(Wet Coating Method)
The compound obtained in each of Ex. 1 to 6, and C$_4$F$_9$OC$_2$H$_5$ (manufactured by 3M, Novec (registered trademark) 7200) as a medium, were mixed to prepare a coating liquid having a solid content concentration of 0.05%. A substrate was dipped in the coating liquid and allowed to stand for 30 minutes, whereupon the substrate was taken out (dip coating method). The coating film was dried at 200° C. for 30 minutes and washed with AK-225, to obtain an article having a surface layer on the surface of the substrate.

(Evaluation Methods)
<Method for Measuring Contact Angle>
The contact angle of about 2 μL of distilled water or n-hexadecane placed on the surface of the surface layer, was measured by using a contact angle measuring apparatus (manufactured by Kyowa Interface Science Co., Ltd., DM-500). Measurements were conducted at five different points on the surface of the surface layer, and the average value was calculated. For the calculation of the contact angle, a 2θ method was employed.

<Initial Contact Angle>
With respect to the surface layer, the initial water contact angle and the initial n-hexadecane contact angle were measured by the above-described measuring method. The evaluation standards are as follows.
Initial Water Contact Angle:
⊚ (excellent): at least 115 degrees.
○ (good): at least 110 degrees and less than 115 degrees.
Δ (acceptable): at least 100 degrees and less than 110 degrees.
× (poor): less than 100 degrees.
Initial n-Hexadecane Contact Angle:
⊚ (excellent): at least 66 degrees.
○ (good): at least 65 degrees and less than 66 degrees.
Δ (acceptable): at least 63 degrees and less than 65 degrees.
× (poor): less than 63 degrees.

<Light Resistance>
To the surface layer, by means of a tabletop xenon arc lamp type accelerated light resistance testing machine (manufactured by Toyo Seiki Seisaku-sho, Ltd., SUNTEST XLS+), light (650 W/m$^2$, 300 to 700 nm) was applied at a black panel temperature of 63° C. for 1,000 hours, whereupon the water contact angle was measured. The smaller the decrease in water contact angle after the accelerated light resistance test, the smaller the decrease in performance due to light, and the better the light resistance. The evaluation standards are as follows.

⊚ (excellent): The change in water contact angle after the accelerated light resistance test is at most 2 degrees.
◯ (good): The change in water contact angle after the accelerated light resistance test is more than 2 degrees and at most 5 degrees.
Δ (acceptable): The change in water contact angle after the accelerated light resistance test is more than 5 degrees and at most 10 degrees.
× (poor): The change in water contact angle after the accelerated light resistance test is more than 10 degrees.

<Abrasion Resistance>

With respect to the surface layer, in accordance with JIS L0849: 2013 (ISO 105-X12: 2001), using a reciprocating traverse testing machine (manufactured by KNT Co.), steel wool Bon Star (#0000) was reciprocated 10,000 times under a pressure of 98.07 kPa at a speed of 320 cm/min, whereupon the water contact angle was measured. The smaller the decrease in water repellency (water contact angle) after the friction, the smaller the decrease in performance due to friction, and the better the abrasion resistance. The evaluation standards are as follows.
⊚ (excellent): The change in water contact angle after reciprocation of 10,000 times is at most 2 degrees.
◯ (good): The change in water contact angle after reciprocation of 10,000 times is more than 2 degrees and at most 5 degrees.
Δ (acceptable): The change in water contact angle after reciprocation of 10,000 times is more than 5 degrees and at most 10 degrees.
× (poor): The change in water contact angle after reciprocation of 10,000 times is more than 10 degrees.

<Light Resistance+Abrasion Resistance>

After the above light resistance test, the above abrasion resistance test was conducted, and evaluation was conducted based on evaluation standards for abrasion resistance (steel wool).

<Chemical Resistance (Alkali Resistance)>

The article was immersed in a 1N aqueous sodium hydroxide solution (pH: 14) for 5 hours, then washed with water and air-dried, whereupon the water contact angle was measured. The smaller the decrease in water contact angle after the test, the smaller the decrease in performance due to alkali, and the better the alkali resistance. The evaluation standards are as follows.
⊚ (excellent): The change in water contact angle after the alkali resistance test is at most 2 degrees.
◯ (good): The change in water contact angle after the alkali resistance test is more than 2 degrees and at most 5 degrees.
Δ (acceptable): The change in water contact angle after the alkali resistance test is more than 5 degrees and at most 10 degrees.
× (poor): The change in water contact angle after the alkali resistance test is more than 10 degrees.

<Chemical Resistance (Salt Water Resistance)>

The salt spray test was carried out in accordance with JIS H8502. That is, the article was exposed to salt atmosphere in a salt spray tester (manufactured by Suga Test Instruments Co., Ltd.) for 300 hours, and then, the water contact angle was measured. The smaller the decrease in water contact angle after the test, the smaller the decrease in performance due to salt water, and the better the salt water resistance. The evaluation standards are as follows.
⊚ (excellent): The change in water contact angle after the salt spray test is at most 2 degrees.
◯ (good): The change in water contact angle after the salt spray test is more than 2 degrees and at most 5 degrees.
Δ (acceptable): The change in water contact angle after the salt spray test is more than 5 degrees and at most 10 degrees.
× (poor): The change in water contact angle after the salt spray test is more than 10 degrees.

<Fingerprint Stain Removability>

An artificial fingerprint liquid (liquid comprising oleic acid and squalene) was deposited on a flat surface of a silicon rubber plug, and then, extra oil was wiped off by a nonwoven fabric (manufactured by Asahi Kasei Corporation, BEMCOT (registered trademark) M-3), to prepare a fingerprint stamp. The fingerprint stamp was placed on the surface layer and pressed under a load of 9.8 N for 10 seconds. The haze at a portion having a fingerprint put, was measured by a haze meter and taken as an initial value. With respect to the portion having a fingerprint put, using a reciprocating traverse testing machine (manufactured by KNT Co.) having tissue paper attached, wiping was carried out under a load of 4.9 N. The value of haze was measured every one reciprocation for wiping, and the number of wiping times until the haze became at most 10% of the initial value, was measured. The smaller the number of wiping times, the easier the removal of fingerprint stain, and the better the fingerprint stain removability. The evaluation standards are as follows.
⊚ (excellent): The number of wiping times is at most 3 times.
◯ (good): The number of wiping times is from 4 to 5 times.
Δ (acceptable): The number of wiping times is from 6 to 8 times.
× (poor): The number of wiping times is at least 9 times.

TABLE 1

| | | | | Ex. | | | | | |
| --- | --- | --- | --- | --- | --- | --- | --- | --- | --- |
| | | | | 7 (1-1) | 8 (1-2) | 9 (1-3) | 10 (1-4) | 11 (1-5) | 12 (4-2) |
| | Fluorinated ether compound | | | | | | | | |
| Dry coating | Initial contact angle | Water | | ⊚ | ⊚ | ⊚ | ⊚ | ⊚ | ⊚ |
| | | n-Hexadecane | | ⊚ | ⊚ | ⊚ | ⊚ | ⊚ | ⊚ |
| | Light resistance | | | ⊚ | ⊚ | ⊚ | ⊚ | ⊚ | ◯ |
| | Abrasion resistance | | | ◯ | ⊚ | ⊚ | ◯ | ◯ | ◯ |
| | Light resistance + abrasion resistance | | | Δ | ◯ | ◯ | ◯ | ◯ | × |
| Wet coating | Initial contact angle | Water | | ⊚ | ⊚ | ⊚ | ⊚ | ⊚ | ◯ |
| | | n-Hexadecane | | ⊚ | ⊚ | ⊚ | ⊚ | ⊚ | ⊚ |
| | Light resistance | | | ⊚ | ⊚ | ⊚ | ⊚ | ⊚ | ◯ |
| | Abrasion resistance | | | ◯ | ⊚ | ⊚ | ◯ | ◯ | ◯ |
| | Light resistance + abrasion resistance | | | Δ | ◯ | ◯ | ◯ | ◯ | × |
| | Chemical resistance | Alkali resistance | | ◯ | ◯ | ◯ | ◯ | ◯ | ◯ |
| | | Salt water resistance | | ◯ | ⊚ | ⊚ | ◯ | ◯ | ◯ |
| | Fingerprint stain removability | | | ⊚ | ⊚ | ⊚ | ⊚ | ⊚ | ⊚ |

It was confirmed that in Ex. 7 to 11 in which the compound (1) was used, initial water/oil repellency, abrasion resistance, fingerprint stain removability, light resistance and chemical resistance were excellent. Particularly, abrasion resistance after the light resistance test was excellent, and it was confirmed that light resistance was more excellent than in Ex. 6 in which a conventional fluorinated ether compound was used.

INDUSTRIAL APPLICABILITY

The fluorinated ether compound of the present invention is useful for various applications for which it is required to impart lubricity and water/oil repellency. For example, it may be used for a display input device such as a touch panel, surface protective coating on a transparent glass or transparent plastic member, kitchen antifouling coating, water repellent moistureproof coating or antifouling coating on electronic device, a heat exchanger or a battery, toiletry antifouling coating, coating on a member which requires liquid repellency while conducting electricity, water repellent/waterproof/water sliding coating on a heat exchanger, or a surface low friction coating on the inside of a vibrating strainer or a cylinder, etc. More specific examples of application include a front protective plate, an antireflection plate, a polarizing plate, an antiglare plate or a surface thereof having an antireflection film, of a display, an apparatus having a display input device of which the screen is operated by human fingers or hands, such as a touch panel sheet or a touch panel display of an apparatus such as a mobile phone or a personal digital assistant, a decorative building material for restroom, bathroom, lavatory, kitchen and the like, waterproof coating for a wiring board, water repellent/waterproof coating on a heat exchanger, water repellent coating on a solar cell, waterproof/water repellent coating on a printed wiring board, waterproof/water repellent coating for an electronic equipment casing or an electronic member, insulating property-improving coating on a power transmission line, waterproof/water repellent coating on a filter, waterproof coating on an electromagnetic wave absorption material or an acoustic material, antifouling coating for bathroom, kitchen instrument and toiletry, water repellent/waterproof/water sliding coating on a heat exchanger, surface low-friction coating on the inside of a vibrating strainer or a cylinder, surface protective coating on a machine component, a vacuum apparatus component, a bearing component, an automobile component, an industrial tool, etc.

This application is a continuation of PCT Application No. PCT/JP2018/047628, filed on Dec. 25, 2018, which is based upon and claims the benefit of priority from Japanese Patent Application No. 2017-251611 filed on Dec. 27, 2017. The contents of those applications are incorporated herein by reference in their entireties.

What is claimed is:

1. A fluorinated ether compound, which is a compound represented by the following formula (1):

wherein $A^1$ is a $C_{1-20}$ perfluoroalkyl group,
$A^2$ is a group represented by the following formula (g1-1), a group represented by the following formula (g1-2) or a group represented by the following formula (g1-3),
$R^{f1}$ is a fluoroalkylene group,
m is an integer of from 2 to 500, and
$(R^{f1}O)_m$ may consist of two or more types of $R^{f1}O$ differing in the number of carbon atoms:

wherein $Q^1$ is a fluorohydrocarbon group having a $CF_2$ or CHF group which bonds with a terminal O of the group $-O-(R^{f1}O)_m$ of formula (1), and optionally comprising a bond B wherein the bond B is $-C(O)NR-$, wherein R is a hydrogen atom, a $C_{1-6}$ alkyl group or a phenyl group, Z is a group having a n+1 valent cyclic structure having a carbon atom or a nitrogen atom to which $Q^1$ is directly bonded and a carbon atom or a nitrogen atom to which $R^{11}$ is directly bonded, $R^{11}$ is a group represented by the following formula (g2), $R^{12}$ is a hydrogen atom, a halogen atom, a hydroxy group or a monovalent organic group, a is an integer of from 1 to 3, b is 2 or 3, n is an integer of at least 2, when a is at least 2, the a $[-C(R^{11})_b (R^{12})_{3-b}]$ may be the same or different, the a $[-N(R^{11})_2]$ may be the same or different, and the a $[-Z(R^{11})_n]$ may be the same or different, and a plurality of $R^{11}$ may be the same or different;

wherein $Q^2$ is a single bond or an alkylene group,
$R^{21}$ is a group represented by the following formula (g3),
$R^{22}$ is an alkyl group,
$R^{23}$ is a hydrolyzable group or a hydroxy group,
c, d and e are each independently an integer of from 0 to 3,
c+d+e is 3,
in at least one $R^{11}$ among a plurality of $R^{11}$ in $A^2$, c is 2 or 3,
when c is at least 2, the c $R^{21}$ may be the same or different,
when d is at least 2, the d $R^{22}$ may be the same or different,
when e is at least 2, the e $R^{23}$ may be the same or different;

wherein $Q^3$ is an alkylene group,
$R^{31}$ is an alkyl group,
$R^{32}$ is a hydrolyzable group or a hydroxy group,
g is an integer of from 1 to 3,
when g is 1, the two $R^{31}$ may be the same or different, and
when g is at least 2, the g $^{32}$ may be the same or different.

2. The fluorinated ether compound according to claim 1, wherein a is 1.

3. The fluorinated ether compound according to claim 1, wherein $Q^2$ is a single bond or a $C_{1-6}$ alkylene group.

4. The fluorinated ether compound according to claim 1, wherein $Q^3$ is a $C_{2-6}$ alkylene group.

5. A fluorinated ether composition comprising at least one type of the fluorinated ether compound as defined in claim 1, and other fluorinated ether compound.

6. A coating liquid comprising the fluorinated ether compound as defined in claim 1, and a liquid medium.

7. An article comprising a substrate and a surface layer formed of the fluorinated ether compound as defined in claim 1 on a surface of the substrate.

8. The article according to claim 7, which has the surface layer on a surface of a member constituting a plane of a touch panel to be touched with fingers.

9. A method for producing an article, which comprises treating a surface of a substrate by dry coating method using the fluorinated ether compound as defined in claim 1 to form a surface layer formed of the fluorinated ether compound on the surface of the substrate.

10. A method for producing an article, which comprises applying the coating liquid as defined in claim 6 to a surface of a substrate by wet coating method, followed by drying to form a surface layer formed of the fluorinated ether compound on the surface of the substrate.

11. A fluorinated ether compound, which is a compound represented by the following formula (2):

$$A^{10}\text{—}O\text{—}(R^{f1}O)_m\text{—}A^{20} \quad (2)$$

wherein $A^{10}$ is a $C_{1\text{-}20}$ perfluoroalkyl group, $A^{20}$ is a group represented by the following formula (g4-1), a group represented by the following formula (g4-2) or a group represented by the following formula (g4-3), $R^{f1}$ is a fluoroalkylene group, m is an integer of from 2 to 500, and $(R^{f1}O)_m$ may consist of two or more types of $R^{f1}O$ differing in the number of carbon atoms:

$$\text{—}Q^1[\text{—}C(R^{110})_b(R^{12})_{3\text{-}b}]_a \quad (g4\text{-}1)$$

$$\text{—}Q^1[\text{—}N(R^{110})_2]_a \quad (g4\text{-}2)$$

$$\text{—}Q^1[\text{—}Z(R^{110})_n]_a \quad (g4\text{-}3)$$

wherein $Q^1$ is a fluorohydrocarbon group having a $CF_2$ or CHF group which bonds with a terminal O of the group $\text{—}O\text{—}(R^{f1}O)_m$ of formula (1), and optionally comprising a bond B wherein the bond B is —C(O)NR—, wherein R is a hydrogen atom, a $C_{1\text{-}6}$ alkyl group or a phenyl group, Z is a group having a n+1 valent cyclic structure having a carbon atom or a nitrogen atom to which $Q^1$ is directly bonded and a carbon atom or a nitrogen atom to which $R^{110}$ is directly bonded, $R^{110}$ is a group represented by the following formula (g5), $R^{12}$ is a hydrogen atom, a halogen atom, a hydroxy group or a monovalent organic group, a is an integer of from 1 to 3, b is 2 or 3, n is an integer of at least 2, when a is at least 2, the a $[\text{—}C(R^{110})_b(R^{12})_{3\text{-}b}]$ may be the same or different, the a $[\text{—}N(R^{110})_2]$ may be the same or different, and the a $[\text{—}Z(R^{110})_n]$ may be the same or different, and a plurality of $R^{110}$ may be the same or different;

$$\text{—}Q^2\text{—}Si(R^{210})_c(R^{22})_d(R^{23})_e \quad (g5)$$

wherein $Q^2$ is a single bond or an alkylene group, $R^{210}$ is a group represented by the following formula (g6), $R^{22}$ is an alkyl group, $R^{23}$ is a hydrolyzable group or a hydroxy group, c, d and e are each independently an integer of from 0 to 3, c+d+e is 3, in at least one $R^{110}$ among a plurality of $R^{110}$ in each of $A^{10}$ and $A^{20}$, c is 2 or 3.

when c is at least 2, the c $R^{210}$ may be the same or different, when d is at least 2, the d $R^{22}$ may be the same or different, when e is at least 2, the e $R^{23}$ may be the same or different;

$$\text{—}Q^{30}\text{—}CH\text{=}CH_2 \quad (g6)$$

wherein $Q^{30}$ is a single bond or an alkylene group.

* * * * *